US012671427B2

(12) United States Patent
Hu et al.

(10) Patent No.: US 12,671,427 B2
(45) Date of Patent: Jun. 30, 2026

(54) AUTONOMOUS SYNCHRONIZATION ARCHITECTURE FOR MASSIVELY TIME-INTERLEAVED ANALOG TO DIGITAL CONVERTERS

(71) Applicant: Avago Technologies International Sales Pte. Limited, Singapore (SG)

(72) Inventors: Boyu Hu, Irvine, CA (US); Guansheng Li, Irvine, CA (US); Haitao Wang, Irvine, CA (US); Chang Liu, Irvine, CA (US); Heng Zhang, Irvine, CA (US); Delong Cui, Tustin, CA (US); Jun Cao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 23 days.

(21) Appl. No.: 18/649,952

(22) Filed: Apr. 29, 2024

(65) Prior Publication Data

US 2025/0337424 A1 Oct. 30, 2025

(51) Int. Cl.
| | |
|---|---|
| *H03M 1/10* | (2006.01) |
| *H03M 1/06* | (2006.01) |
| *H03M 1/12* | (2006.01) |
| *H03M 1/60* | (2006.01) |

(52) U.S. Cl.
CPC ....... *H03M 1/1009* (2013.01); *H03M 1/0624* (2013.01); *H03M 1/1215* (2013.01); *H03M 1/1255* (2013.01); *H03M 1/60* (2013.01)

(58) Field of Classification Search
CPC .......................... H03M 1/1009; H03M 1/0624
USPC ...................................................... 341/120, 155
See application file for complete search history.

(56) References Cited

U.S. PATENT DOCUMENTS

| | | | | |
|---|---|---|---|---|
| 11,115,040 B1 * | 9/2021 | Xu | ........................ | H03M 1/121 |
| 11,916,561 B1 * | 2/2024 | Hu | ...................... | H03M 1/0624 |

OTHER PUBLICATIONS

Extended European Search Report, European Application No. 25172468.8 dated Sep. 25, 2025, 12 pages.

* cited by examiner

*Primary Examiner* — Khai M Nguyen
(74) *Attorney, Agent, or Firm* — King Intellectual Asset Management

(57) ABSTRACT

An apparatus includes a first phase interpolator configured to receive a first clock signal and generate a second clock signal, and an ADC that includes a clock divider configured to generate a third clock signals based on the second clock signal, a token generator configured to generate a first token signal, a first phase detector configured to generate a first and second output based on the first and third clock signals, and a second phase detector configured to generate a third output based on the token signal. Control logic may be provided to perform a foreground calibration to align the first token signal with a second token signal of a second ADC-group, and a background calibration to align the third clock signal with the first clock signal.

20 Claims, 15 Drawing Sheets

Figure 4:
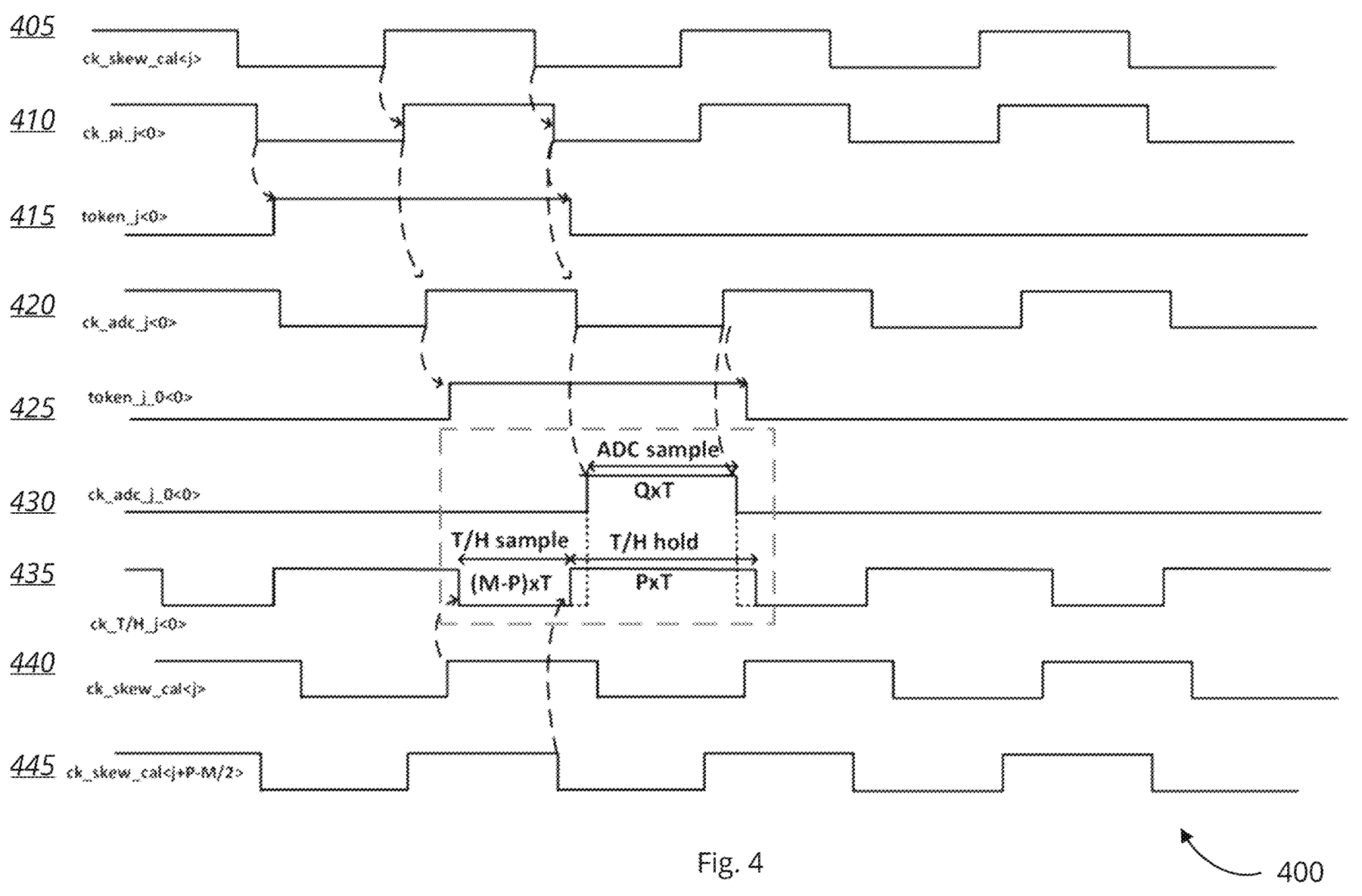

405  ck_skew_cal<j>

410  ck_pi_j<0>

415  token_j<0>

420  ck_adc_j<0>

425  token_j_0<0>

430  ck_adc_j_0<0>

435  ck_T/H_j<0>

440  ck_skew_cal<j>

445  ck_skew_cal<j+p-M/2>

ADC sample
QxT

T/H hold
PxT

T/H sample
(M-P)xT

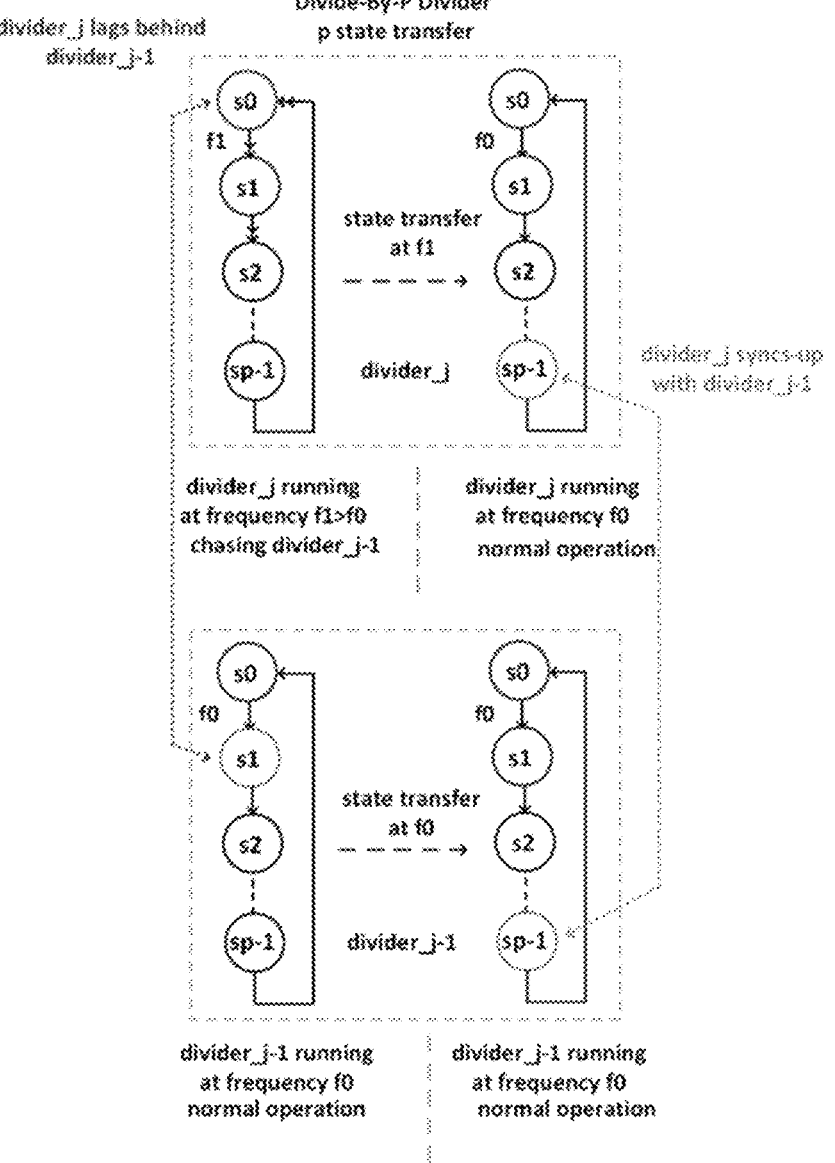
Fig. 7B
700B

AUTONOMOUS SYNCHRONIZATION ARCHITECTURE FOR MASSIVELY TIME-INTERLEAVED ANALOG TO DIGITAL CONVERTERS

COPYRIGHT STATEMENT

FIELD

The present disclosure relates, in general, to methods, systems, and apparatuses for synchronization in massively time-interleaved (TI) analog to digital converters (ADC).

BACKGROUND

Massively time-interleaved ADC has become a widely adopted architecture for ultra-wideband wireline and wireless data systems. To support increasingly higher speed communications, ADCs run at increasingly higher speeds, while unit ADCs are subject to power and size constraints. Thus, TI-ADCs rely on a large number of unit ADCs connected by multi-level track-and-hold (T&H) circuits. Due to the number of unit ADCs, however, synchronization of sampling clock signals (also referred to simply as "clocks" for short) between distributed groups of unit ADCs present challenges. Moreover, synchronization of the sampling clock within a group of unit ADCs also poses challenges, while detection of synchronization errors is difficult.

Accordingly, a synchronization architecture for TI-ADCs is provided.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

FIG. 4 is a timing diagram of various signals within the ADC-group, in accordance with various embodiments;

FIG. 7B is a state diagram illustrating internal-state transfer status during synchronization, in accordance with various embodiments;

FIG. 9 illustrates a series of timing diagrams illustrating alignment between T&H clocks, unit ADC clocks, and token signals during two-step synchronization, in accordance with various embodiments;

DETAILED DESCRIPTION OF EMBODIMENTS

Figure 1:
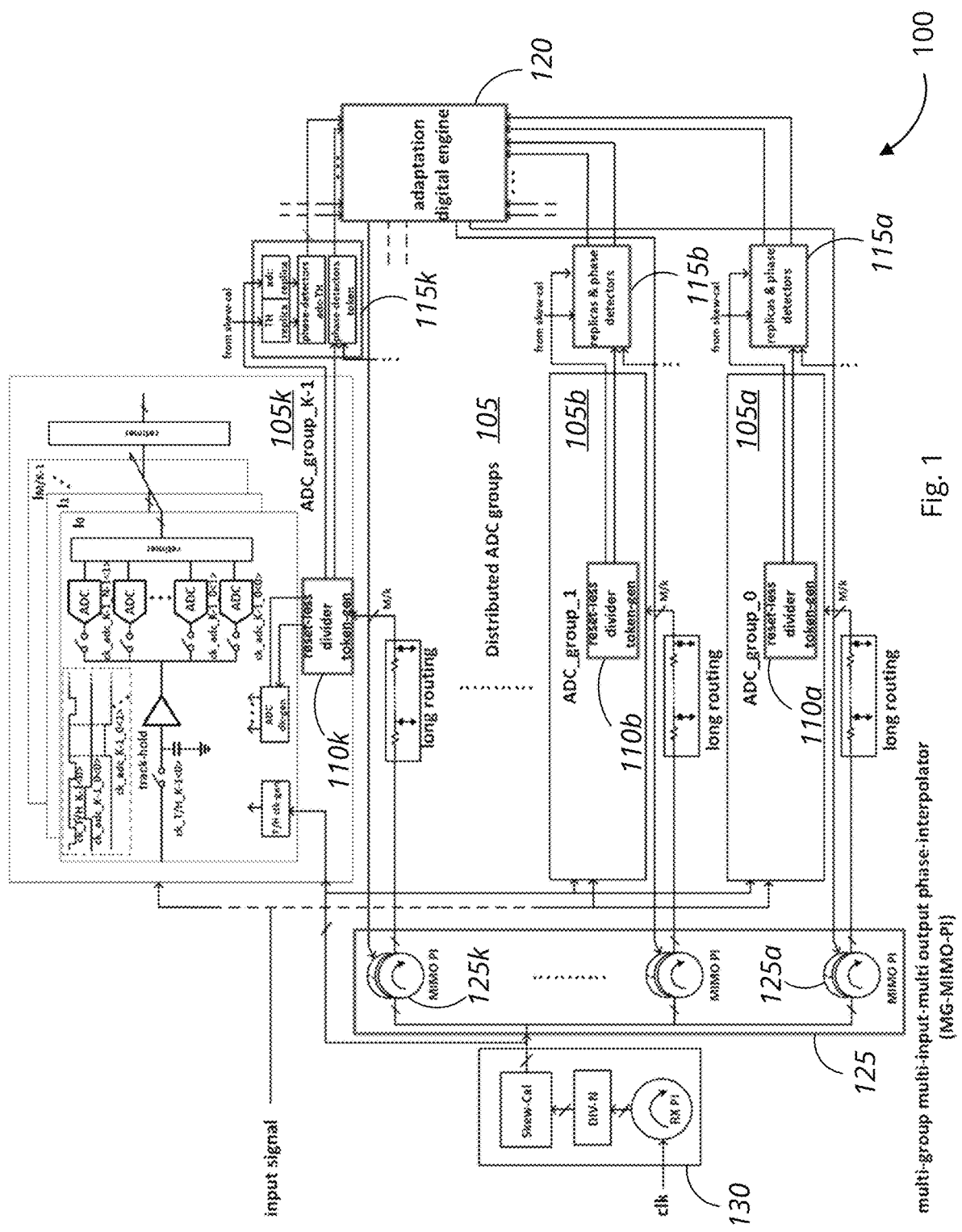
FIG. 1 is a schematic block diagram of an autonomous synchronization architecture for massively time-interleaved ADCs, in accordance with various embodiments.

Various embodiments set forth an architecture for interactive video bitstream with embedded messaging data.

In some embodiments, an ADC with autonomous synchronization is provided. The ADC includes a multi-group multiple input multiple output phase interpolator (MG-MIMO-PI). The MG-MIMO-PI includes one or more multiple input multiple output phase interpolators (MIMO-PI), and is configured to receive a first clock signal, where a first MIMO-PI of the one or more MIMO-PIs is configured to generate a second clock signal based on the first clock signal. The ADC further includes one or more analog to digital converter groups (ADC-groups), each ADC-group of the one or more ADC-groups being coupled to a respective MIMO-PI. A first ADC-group of the one or more ADC-groups is coupled to the first MIMO-PI. The first ADC-group includes a clock divider configured to generate a third clock signals based, at least in part, on the second clock signal, and a token generator configured to generate a first token signal based, at least in part, on the second clock signal. The first ADC-group further includes one or more sub-analog to digital converters (sub-ADCs). A first sub-ADC of the one or more sub-ADCs includes one or more unit-analog to digital converters (unit-ADCs) configured to sample an input signal based, at least in part, on the third clock signal, a first phase detector configured to generate a first output indicating a phase of the first clock signal relative to a phase of the third clock signal, and a second output indicating a phase of a first reference signal relative to the phase of the third clock signal, and a second phase detector configured to generate a third output indicating a phase of the token signal relative to a second reference signal. The ADC further includes an adaptation engine configured to perform a foreground calibration, wherein the foreground calibration is configured to cause the first token signal of the first ADC-group to be aligned with a second token signal of a second ADC-group, and perform a background calibration, wherein the background calibration is configured to cause the third clock signal to be aligned with the first clock signal such that a first time margin is created between a falling edge of the first clock signal and a falling edge of the third clock signal.

In further embodiments, an apparatus for autonomous synchronization of an ADC is provided. The apparatus includes a first phase interpolator (PI) of a plurality of phase interpolators, the first phase interpolator configured to receive a first clock signal and generate a second clock signal based on the first clock signal, and a first analog to digital converter-group (ADC-group) of a plurality of ADC-groups. The first ADC-group includes a clock divider configured to generate a third clock signals based, at least in part, on the second clock signal, and a token generator configured to generate a first token signal based, at least in part, on the second clock signal. The first ADC-group may further include a first sub-analog to digital converter (sub-ADC) of one or more sub-ADCs. The first sub-ADC includes one or more unit-analog to digital converters (unit-ADCs) configured to sample an input signal based, at least in part, on the third clock signal. The first ADC-group may further include a first phase detector configured to generate a first output indicating a phase of the first clock signal relative to a phase of the third clock signal, and a second output indicating a phase of a first reference signal relative to the phase of the third clock signal, and a second phase detector configured to generate a third output indicating a phase of the token signal relative to a second reference signal. The apparatus includes control logic configured to perform a foreground calibration, wherein the foreground calibration is configured to cause the first token signal of the first ADC-group to be aligned with a second token signal of a second ADC-group, and a background calibration, wherein the background calibration is configured to cause the third clock signal to be aligned with the first clock signal such that a first time margin is created between a falling edge of the first clock signal and a falling edge of the third clock signal.

In further embodiments, a system for autonomous synchronization in an ADC is provided. The system includes a multi-group multiple input multiple output phase interpolator (MG-MIMO-PI) comprising one or more multiple input multiple output phase interpolators (MIMO-PI), the MG-MIMO-PI configured to receive a first clock signal, wherein a first MIMO-PI of the one or more MIMO-PIs is configured to generate a second clock signal based on the first clock signal, and a first ADC. The first ADC includes a clock divider configured to generate a third clock signals based, at least in part, on the second clock signal, and a token generator configured to generate a first token signal based, at least in part, on the second clock signal. The system includes control logic configured to perform a foreground calibration, wherein the foreground calibration is configured to cause the first token signal to be aligned with a second token signal of a second ADC, and perform a background calibration, wherein the background calibration is configured to cause the third clock signal to be aligned with the first clock signal such that a first time margin is created between a falling edge of the first clock signal and a falling edge of the third clock signal.

In the following description, for the purposes of explanation, numerous details are set forth to provide a thorough understanding of the described embodiments. It will be apparent to one skilled in the art, however, that other embodiments may be practiced without some of these details. Several embodiments are described herein, and while various features are ascribed to different embodiments, it should be appreciated that the features described with respect to one embodiment may be incorporated with other embodiments as well. However, no single feature or features of any described embodiment should be considered essential to every embodiment of the invention, as other embodiments of the invention may omit such features.

When an element is referred to herein as being "connected" or "coupled" to another element (which includes mechanically, electrically, or communicatively connecting or coupling), it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

When an element is referred to herein as being "disposed" in some manner relative to another element (e.g., disposed on, disposed between, disposed under, disposed adjacent to, or disposed in some other relative manner), it is to be understood that the elements can be directly disposed relative to the other element (e.g., disposed directly on another element), or have intervening elements present between the elements. In contrast, when an element is referred to as being "disposed directly" relative to another element, it should be understood that no intervening elements are present in the "direct" example. However, the existence of a direct disposition does not exclude other examples in which intervening elements may be present.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

Massive TI-ADC architectures have become increasingly common for ultra-wideband applications. Within these massively time-interleaved architectures, it is very difficult to synchronize the sampling-clocks between the distributed ADC-groups. Each distributed ADC-group follows a respective pre-defined sampling sequence required by their respective data serialization orders.

Conventional approach utilizes a global reset signal to synchronize the clock-divider/token-generator inside each distributed ADC-group at chip start-up to ensure that all the dividers/tokens are synchronized. The data output sequences among ADC-groups are thus defined by the phase differences of the input driving clocks. This approach has two major potential issues: 1) the global reset signal could be sampled incorrectly at start-up due to stringent timing constrains and abrupt IR-drop due to start-up rushing current from supply 2) the internal state of dividers/tokens could be disrupted by the ambient aggressor signal(s) and randomly set into any wrong state during operation. Neither of the two issues is recoverable after start-up and may not be resolved even with a chip reset Furthermore, it is difficult to synchronize the multi-level interleaving sampling-clocks within a respective distributed ADC-group. Each ADC-group includes several T&H stages. Due to different logic-depth on the T&H clock path and unit-ADC clock path, the sampling window between T&H and unit-ADC varies significantly across Process-Voltage-Temperature-Extraction (PVTE) corners. The mis-alignment of such sampling window would lead to wrongly sampled data and thus severely degraded system performance.

Additionally, it is extremely difficult to detect and correct synchronization errors in both intra- and inter-distributed ADC-groups concurrently. The detection requires accurate timing information across multi-level interleaving hierarchy without disturbing the normal operation of the ADC. The correction would need to support simultaneously independent synchronization between T&H and unit-ADCs within each different distributed ADC-groups while retaining the synchronization among those ADC-groups. Accordingly, an autonomous synchronization architecture is provided to synchronize inter-group and intra-group ADC clocks with respective T&H circuit clocks, as set forth below.

FIG. 1 is a schematic block diagram of an autonomous synchronization architecture 100 for massively time-interleaved ADCs, in accordance with various embodiments. The architecture 100 incudes one or more distributed ADC-groups 105a-105k (collectively, "ADC-groups 105"), which include respective clock divider/token generator 110a-110k (collectively the "clock divider/token generators 110"), and further include one or more respective replica and phase detector circuits 115a-115k (collectively the "replica and phase detector circuits 115"), adaptation engine 120, and multiple-group multiple-input-multiple-output phase interpolator (MG-MIMO-PI) 125, including respective MIMO PIs 125a-125k, and global clock generator 130. It should be noted that the various elements of the system 100 are schematically illustrated in FIG. 1, and that modifications to the various components and other arrangements of the system 100 may be possible and in accordance with the various embodiments.

In various embodiments, the architecture 100 may include one or more distributed ADC-groups 105. Each one or more distributed ADC-groups 105 may be referred to herein as a "first-level" ADC, wherein the ADC-groups 105a-105k are interleaved on the "first-level." Each ADC-group 105a-105k may further comprise one or more sub-ADCs, referred to interchangeably as "ADC slices." Each of the sub-ADCs may, correspondingly, be referred to as a "second-level" ADC, where each sub-ADC is interleaved on a "second-level." Each sub-ADC may, in turn, include one or more unit-ADCs. Unit-ADCs may be referred to as a "third-level" ADC, where each unit-ADC is interleaved on the "third-level."

In some examples, the ADC depicted in architecture 100, may be referred to as a multi-group (MG) TI-ADC with M×N unit-ADCs, where "k" is the number of ADC-groups, "M" is the total number of ADC slices (e.g., sub-ADC) across all k-number of ADC-groups, and "N" is the number of unit-ADCs in each respective ADC slice. Thus, M×N may represent the total number of unit-ADCs across all ADC-groups 105 of the architecture 100.

In various examples, Each ADC-group 105a-105k may include a respective clock divider/token generator 110a-110k, configured to generate a respective clock signal for a corresponding ADC-group 105a-105k. Each ADC slice of an ADC-group 105 may further include a respective T&H circuit, driven by a respective clock signal (e.g., a "TH clock"). The clock divider/token generator 110a-110k may further be coupled to respective replica and phase detector circuits 115a-115k. Accordingly, each respective ADC-group 105a-105b may include a respective replica and phase detector circuit 115a-115k., which are in turn coupled to an adaptation engine 120. The adaptation engine 120 may be configured to provide calibration information (e.g., feedback) to the MG-MIMO-PI 125. Accordingly, the MG-MIMO-PI 125 may be configured to generate a respective clock signal for each of the respective clock divider/token generators 110a-110k of each ADC-group 105a-105k, wherein each respective clock signal is provided via respective MIMO PI 125a-125k of the MG-MIMO-PI 125. The MG-MIMO-PI 125 is configured to generate the respective input clock signals based on a global clock signal, which is in turn provided by the global clock generator 130.

In various examples, the architecture 100 allows for synchronization of each of the unit-ADCs of each of the ADC slices of each respective ADC-group 105a-105k, without reliance on a global reset signal. Specifically, in various embodiments, the architecture allows for synchronization between different ADC-groups 105a-105k, and within respective ADC-groups 105a-105k, and synchronization between respective T&H circuits and unit-ADCs within each ADC-group 105a-105k. In various embodiment, synchronization may be provided via MG-MIMO-PI 125 in combination with the respective clock divider/token generators 110a-110k, and replica and phase detector circuits 115a-115k.

The adaptive tracking of this multi-level timing relationship across Process-Voltage-Temperature-Extraction (PVTE) variations and ambient conditions may be provided via the adaptation engine 120 in the digital domain. In some embodiments, the adaptation engine 120 may be implemented logic, and may further include hardware, software, or a combination of both hardware and software. Accordingly, an "engine," as used herein, may refer to software (or hardware) components (e.g., code, modules, etc.) utilized to implement a corresponding functionality. The engine, as described above, may in some examples, be implemented as "logic." Logic may be implemented in hardware (e.g., custom integrated circuit (IC), programmable logic, such as a field-programmable gate array (FPGA), and/or discrete logic), software, and/or as a combination of hardware and software. Accordingly, in various examples, the adaptation engine 120 may be considered control logic in the ADC 100 configured to control (e.g., generate control signals) for the MG-MIMO-PI 125.

In various embodiments, MG-MIMO-PI 125 timing adjustments may be utilized to synchronize the internal states of respective clock divider/token generators 110a-110k (e.g., inter-ADC-group synchronization), and respective T&H circuits of each sub-ADCs of each respective ADC-group 105a-105k (e.g., intra-ADC-group synchronization). As such, in various embodiments, utilizing the MG-MIMO-PI 125 eliminates the need for conventional reset-based synchronization. Moreover, the MG-MIMO-PI 125 is able to correct for ambient-aggressor induced synchronization errors on-the-fly.

In various embodiments, the MG-MIMO-PI 125 may be configured to adjust multi-level timings within architecture 100 (e.g., timings across and within each of the distributed ADC-groups 105), and drive the long-routing clock distribution channel(s) within the architecture 100 (e.g., clock distribution channels to each respective ADC-group 105a-105k). In some examples, the MG-MIMO-PI 125 may drive the long-routing clock distribution channels without utilizing clock drivers.

In some embodiments, the MG-MIMO-PI 125 may generate a clock signal (e.g., an input clock signal) covering a whole period of the T&H clock signal, ensuring alignment between T&H and unit-ADCs, as well as ensuring compensation of internal-state mismatches between clock-dividers/ token-generators 110a-110k in respective ADC-groups 105a-105k via a respective MIMO PI 125a-125k of the MG-MIMO-PI 125. As sample clock alignment resolution inherently scales with input data rate changes, a wide range of data-rate changes may be supported by finely interpolated resolution offered by the MG-MIMO-PI 125.

Accordingly, in various embodiments, an MG-MIMO-PI 125 may be a grouping of one or more MIMO PIs 125a-125k. Each MIMO PI 125a-125k may further refer to a phase interpolator configured to generate multiple output signals based on one or more input signals (as will be described in greater detail below with respect to FIG. 5). Each respective MIMO PI 125a-125k may, thus, include one or more PI "slices," each PI generating a respective output clock signal having a respective phase. Utilizing the MG-MIMO-PI 125 architecture set forth, a common control signal (e.g., a control-code) may be utilized to between each of the individual PI slices of the MG-MIMO-PI 125. A PI "slice," as used herein, may be a "unit-cell" of the MIMO PI, which itself may be an individual PI which generates a respective output signal having a phase that is a "slice" of an input signal of the MG-MIMO-PI 125. In some embodiments, the MG-MIMO-PI 125 may be an M-phase PI configured to generate an M-number of outputs having an M-number of respective phases. Each MIMO PI 125a-125k may, accordingly, be an M/k-phase PI, configured to accept an M/k-phase input (e.g., an M/k-number of inputs, each having a respective phase), and generating an M/k-phase output (e.g., an M/k-number of outputs, each having a respective phase).

In various embodiments, the timing-detection clock signals may be provided by a corresponding replica and phase detector circuit 115, without disturbing the critical clock-path. As time-margin is defined by utilizing phases and thus naturally scales as input data rate changes. This leads to relaxed time-margins for inter-distributed ADC-group synchronization detection with a M×T time window.

In various examples, the adaptation engine 120 may be configured to synchronize both inter-ADC-group and intra-ADC-group timings. For example, in some embodiment, the adaptation engine 120 may be configured to implement a two-step cooperative adaptive synchronization for both inter-distributed ADC-groups, and intra-ADC-group synchronization between T&H and unit-ADCs within each ADC-group 105a-105k.

In various examples, a single synchronization position may be guaranteed by the convergence criteria. The adaptation engine 120 may, in some embodiments, utilize a foreground and background calibration schemes. In some examples, the foreground and background calibration schemes may be configured to co-operate, in which foreground calibration may be performed based, at least in part, on input from background calibration, and/or vice versa, the background calibration may be performed based, at least in part, on input from the foreground calibration. In various examples, calibration (foreground and/or background) may be performed in real-time and in-situ, providing timing adaptation without disturbing the data-traffic. Details of the calibration scheme are set forth in greater detail below with respect to FIGS. 10A-12C.

In various embodiments, the ADC 100 may further include a global clock generator configured to generate a global clock signal from which clock signals within the ADC 100 may be generated. In some embodiments, the global clock generator 130 may include a receiver phase interpolator (Rx PI), clock divider, and skew calibration logic. The global clock generator 130 may receive an external clock signal, from which the global clock signal is generated. Skew calibration logic may be configured to calibrate timing skew of the global clock. Specifically, timing skew (also commonly called "clock skew") may refer to differences in the clock signal (e.g., differences in the relative phase of the input clock signals) from an expected relative phase of the input clock signals at each of the respective sub-ADCs.

Thus, skew calibration logic may calibrate timing skew of the respective clock signals provided to the MG-MIMO-PI 125, and each of the respective T&H circuits.

The one or more sub-ADCs (e.g., ADC slices) may further receive, as input, a respective "slice" of an analog input signal that has been sliced into an M/k-number of slices, and convert the respective slice of the analog input signal into a respective slice of the digital output signal. Accordingly, an ADC slice may refer to a respective set of unit-ADCs that processes a respective slice of the input signal. The outputs of each of the one or more ADC slices may further be coupled to a retimer circuit, which may adjust timing of the outputs of the respective ADC slices (e.g., slices of the digital signal) to form a digital output signal, and provide the digital output signal to a downstream processor (e.g., a digital signal processor (DSP) (not shown)).

The respective sub-ADC may receive a respective clock signal from respective clock-dividers/token-generators 110a-110k. In various examples, the input clock signal (from MG-MIMO-PI 125) may be divided via the respective clock-dividers/token-generators 110a-110k. Accordingly, the respective clock-dividers/token-generators 110a-110k may divide the input clock into a respective M/k-number of divided clocks corresponding to each of an M/k-number of channels per respective ADC-group.

Figure 2:
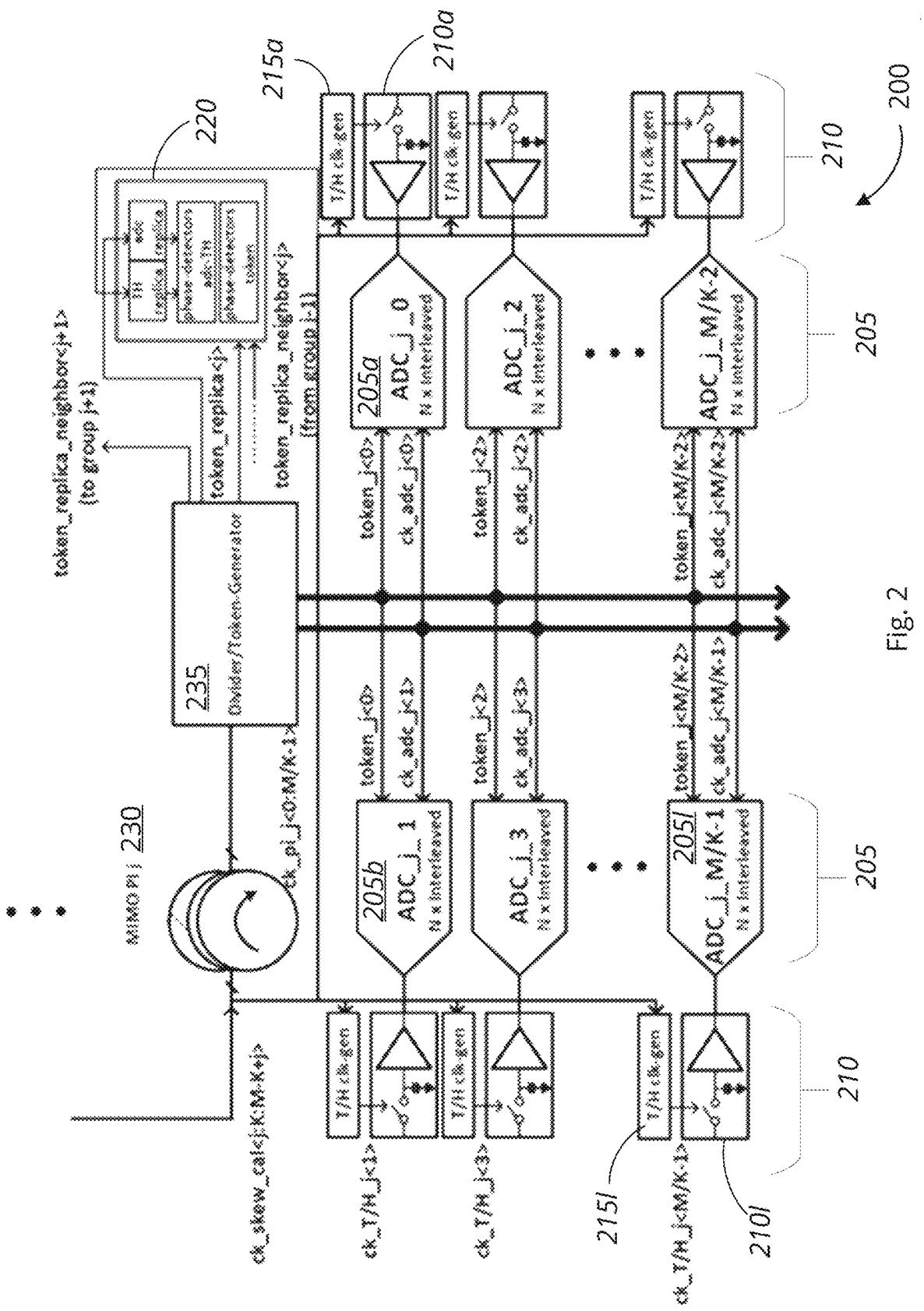
FIG. 2 is a schematic block diagram of an ADC-group with an autonomous synchronization architecture, in accordance with various embodiments.

FIG. 2 is a schematic block diagram of an ADC-group 200 with an autonomous synchronization architecture, in accordance with various embodiments. The ADC-group 200 includes one or more sub-ADCs 205a-2051 (where "1" is an integer, where 1=M/k, where M is the total number of sub-ADCs across all ADC-groups, and k is the number of ADC-groups), respective T&H circuits 210a-2101 (including respective T&H clock generators 215a-2151), a replica and phase detection circuit 220, MIMO-PI 230, and clock divider/token generator 235. It should be noted that the various elements of the ADC-group 200 are schematically illustrated in FIG. 2, and that modifications to the various components and other arrangements of the ADC-group 200 may be possible and in accordance with the various embodiments.

As previously described, the ADC-group 200 may include one or more sub-ADCs 205a-2051. Each sub-ADC 205a-2051 may respectively comprise one or more unit-ADCs as set forth in greater detail below with respect to FIG. 3. Each sub-ADC may be coupled to a respective T&H circuit 210a-2101, which also includes respective T&H clock generator 215a-2151.

In various embodiments, the respective T&H circuits 210a-2101 are configured to sample an input signal, as clocked by a respective clock signal (e.g., T&H clock signal) generated by the respective T&H clock generator 215a-2151. Each T&H clock generator 215a-2151 may receive a respective input clock signal from a global clock generator (such as global clock generator 130 of FIG. 1). From the global clock, MG-MIMO-PI 125 may generate respectively phase-shifted clock signals for each respective ADC-group 105a-105k.

In some embodiments, the T&H circuit, also referred to as a "sample-and-hold" circuit, is an input sampling circuit for each ADC slice of the one or more ADC slices (e.g., sub-ADCs 205a-2051). The system clock, for example an I/IB/Q/QB clock from a receiver phase-locked loop (PLL).

The clock divider/token generator 235 may configured to divide a respective input clock signal from the respective MIMO PI 230 into a respective M/k-number of divided clocks, as previously described. More specifically, in various embodiments, the MIMO PI 230 may include one or more PI slices (e.g., and M/k number of PI slices for each sub-ADC 205a-2051 of the ADC-group 200). Each PI slice may take a multi-phase (e.g., an M/k number of phases) input clock with k×T space between each neighboring phase, and generate an output clock signal of a respective phase. Each PI slice, for example, may output an output clock signal that advances incrementally in phase from a preceding slice PI slice in a cyclic way, enforcing a phase relationship of the output M/k-phase signal, ck_pi_j<0:M/k−1>. Thus, the output of the MIMO PI 230 may be an M/k-number of clock signals, where each clock signal ck_pi_j<0> to ck_pi_j<M/k−1>, are phase shifted clock signals, separated by k-number of steps (e.g., a k×T space between neighboring phases).

Figure 3:
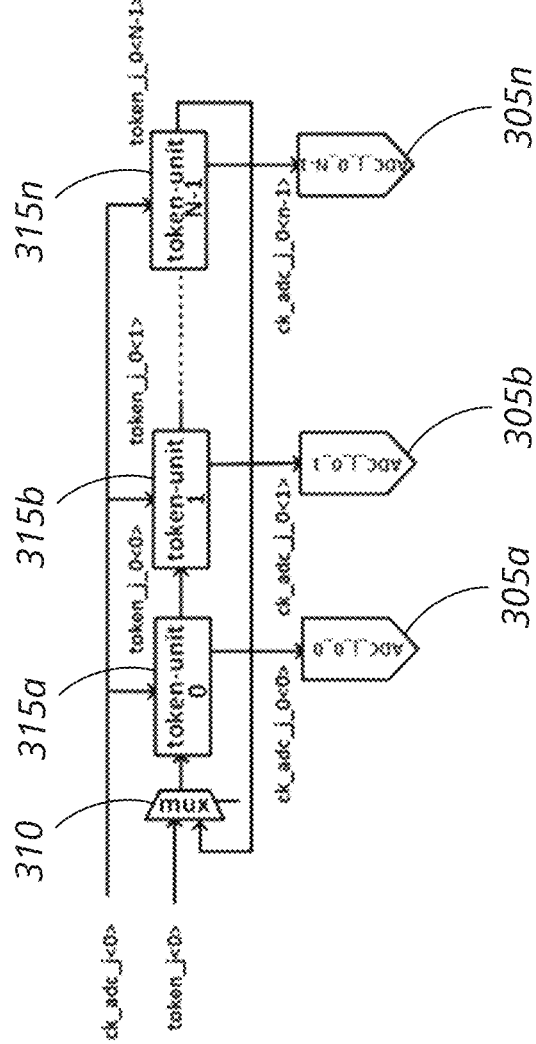
FIG. 3 is a schematic block diagram of a group of interleaved unit-ADCs within a respective ADC of the ADC-group, in accordance with various embodiments.

FIG. 3 is a schematic block diagram of a respective sub-ADC 300 of an ADC-group, in accordance with various embodiments. The sub-ADC 300 includes one or more respective unit-ADCs 305a-305n, multiplexer 310, and one or more respective token generators 315a-315n. Accordingly, as previously described, each respective sub-ADC 300 includes an N-number of unit-ADCs 315a-315n. It should be noted that the various elements of the sub-ADC 300 are schematically illustrated in FIG. 3, and that modifications to the various components and other arrangements of the sub-ADC 300 may be possible and in accordance with the various embodiments.

FIG. 4 is a timing diagram 400 of various signals within the ADC. Specifically, the signals depicted in FIG. 4 may be described with reference to elements of ADC 100, ADC-group 200, and/or sub-ADC 300 of FIGS. 1-3. Accordingly, with reference to FIGS. 1-4, in various examples, the corresponding j-th group of M/k phase clocks from the skew calibration logic are sent to j-th branch of MG-MIMO-PI 125. After adaptive adjustments (e.g., phase interpolator rotation via adaptation engine 120), the synthesized clocks may drive the clock divider/token-generator 235 which distributes ck_adc_j<0,1, . . . M/K−1> (e.g., input clock signals) and tokens (e.g., token signals) token_j<0,2, . . . M/K−2> to each sub-ADC 205a-2051, ADC_j_0 (e.g., sub-ADC 205a) through ADC_j_M/K−1.

Sequences between sub-ADCs 205a-2051 are defined by the sequences of the token signal token_j<0,2, . . . M/K−2>. The sequences between ADC-groups 105a-105k are defined by the relationship between token_replica<j> and token_replica_neighbor<j>, the latter of which is provided by neighboring ADC-group j−1 (e.g., the immediately preceding ADC-group).

Accordingly, in various embodiments, each token_ j<0,2, . . . M/K−2> is sampled by corresponding clocks ck_adc_j<0, . . . M/K−1> with sufficient timing margin, and passed through a respective token generator (e.g., token generators 315a-315n) from token-unit_0 to token-n_unit_N−1 to generate tokens token_j_i<0 . . . N−1>. Each of these tokens generates unit-ADC clocks ck_adc_j_ i<0 . . . N−1>, together with ck_adc_j<i> for each of the N-number of unit-ADCs 305a-305n.

Thus, the token signal is a signal configured to control the sequence in which ADC-groups, respective sub-ADCs, and respective unit-ADCs sample an input signal. Thus, alignment of the token signals ensures that the various ADC-groups, and sub-ADCs within each ADC-group are synchronized in operation (e.g., do not overlap in sampling the signal).

With respect to timing between respective T&H circuits (e.g., T&H circuits 210a-2101 and T&H clock generators 215a-2151) and sub-ADCs 205a-2051 within an ADC-group, T&H sample clocks ck_T/H_j<0 . . . M/K−1> may be generated by the respective T&H clock generators 215a-2151 from the output of the skew calibration logic (e.g., a global clock) of the global clock generator 130. Thus, in various embodiments, the T&H sample clocks do not shift while MG-MIMO-PI 125 rotates (e.g., causes a phase-shift) the respective input clock signals. A rotation, as used herein, may refer to a shift in phase of the signal. In some examples, a rotation may be an incremental/discrete shift in phase introduced by a PI (e.g., by one "slice" or step of a divided input signal). In other examples, a rotation may be continuous shift.

Figure 5:
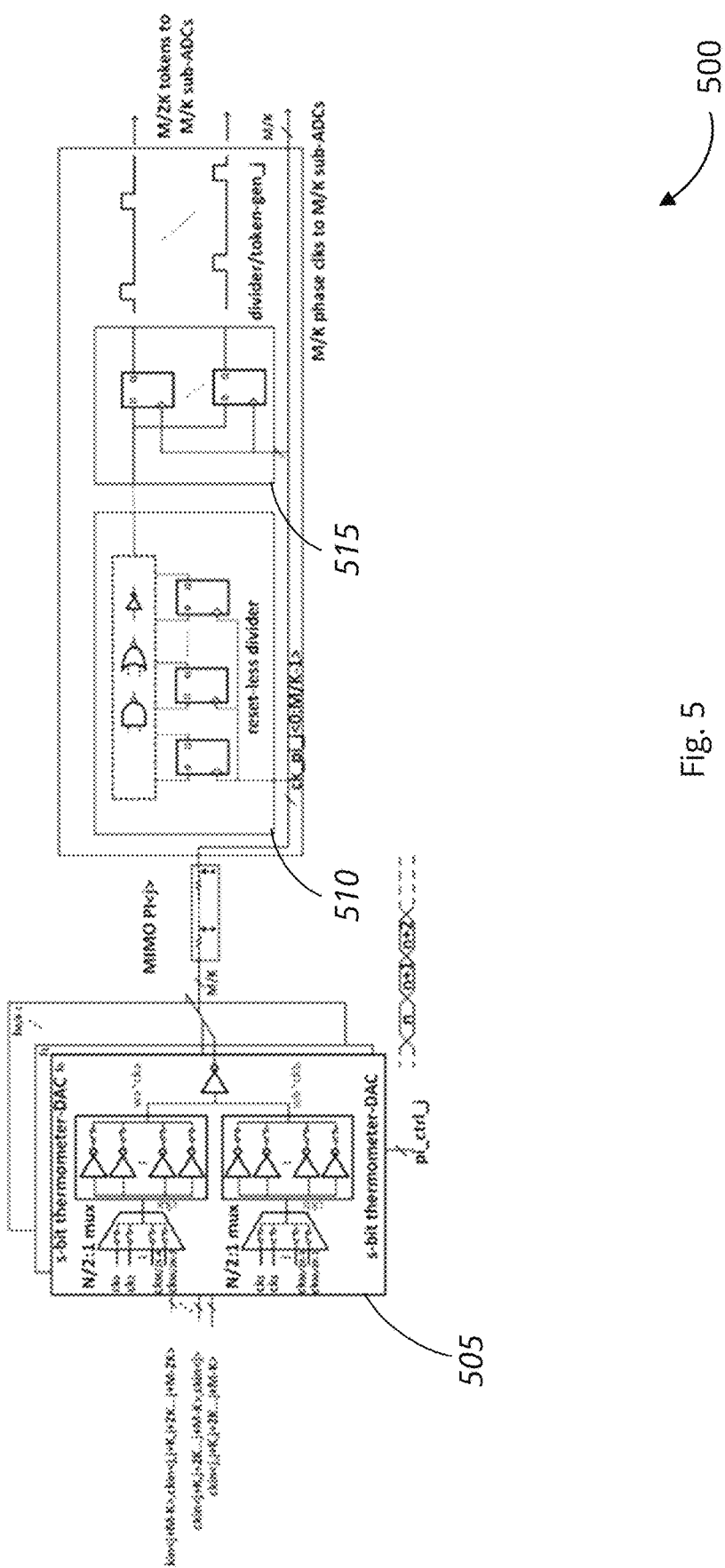
FIG. 5 is a schematic block diagram of an architecture for synchronization between T&H circuits and respective unit ADCs, in accordance with various embodiments.

FIG. 5 is a schematic block diagram of a subcircuit 500 for synchronization between T&H circuits and respective unit ADCs, in accordance with various embodiments. The subcircuit 500 depicts a respective MIMO PI 505 of an MG-MIMO-PI, and respective clock divider/token generator comprising clock divider 510 and token generator 515. It should be noted that the various elements of the subcircuit 500 are schematically illustrated in FIG. 5, and that modifications to the various components and other arrangements of the subcircuit 500 may be possible and in accordance with the various embodiments.

In various embodiments, each respective MIMO slice of the MIMO PI 505 may include a one or more multiplexers and a respective one or more s-bit thermometer DACs. Specifically, each MIMO PI 505 slice may respectively include two multiplexers (e.g., a first and second multiplexer). In some examples, the first and second multiplexers may be M/(2k): 1 multiplexers. Accordingly, the first multiplexer may be coupled to even-numbered input clock signals ($ck_0$–$ck_{(M/2k)-2}$) (e.g., even numbered first-level clock signals), whereas the second multiplexer may receive odd-numbered input clock signals ($ck_1$–$ck_{(M/2k)-1}$) (e.g., odd numbered first-level clock signals).

In various examples, the output of the first multiplexer may be denoted as cka, while the output of the second multiplexer may be denoted as ckb. The paired outputs cka and ckb may thus provide any neighboring two phases of clock signals, across the whole M×T range, with a k×T time spacing between the neighboring phases. In some examples, the neighboring phases may be set through an even-side and odd-side multiplexer selection code, and as further weighted by respective DACs.

In various examples, the outputs cka and ckb may be weighted via respective DACs, (e.g., a first DAC and second DAC). In some examples, the first DAC and second DAC may be s-bit thermometer DACs. The first DAC may weight cka by a first weighting factor wa, and second DAC 225 may weight ckb by a second weighting factor wb. Accordingly, the weighted clock signals wa*cka and wb*ckb may be added, in vector form, through the two output-connected s-bit thermometer-DACs to generate the interpolated clock signal ck_pi within the k×T timing spacing. In some further examples, a phase within the k×T timing space may be selected by selection of weighting factors wa and wb.

Figure 6:
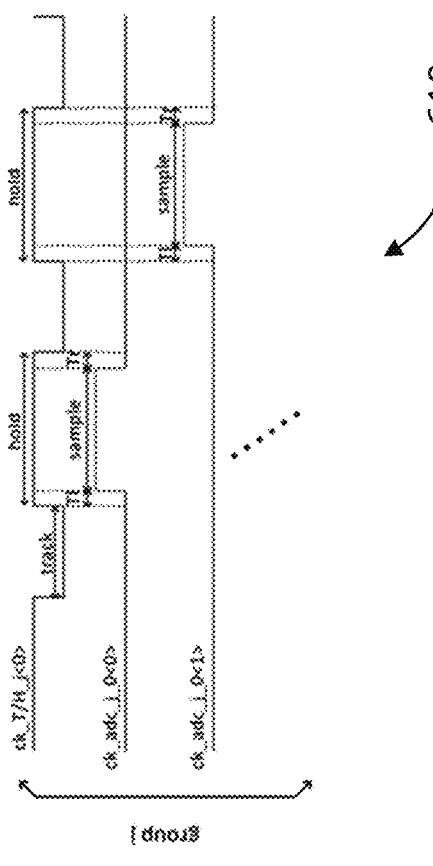
FIG. 6 is a timing diagram illustrating alignment between T&H and unit ADC clocks, in accordance with various embodiments.
Figure 6:
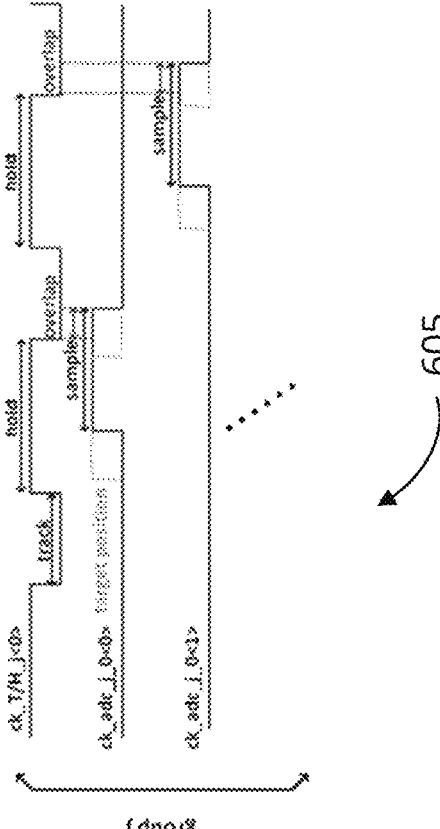

FIG. 6 illustrates timing diagrams 605, 610 illustrating alignment between T&H sample clocks and unit-ADC input clocks, in accordance with various embodiments. Specifically, timing diagram 605 illustrates misalignment between T&H clock signals (e.g., ck_T/H_j<0>) and respective ADC input clocks (e.g., ck_adc_j_0<0> and ck_adc_j_0<1>). It is to be understood that specific clock signals are shown for explanation purposes only, and to illustrate relative timing alignment between adjacent input clock signals (e.g., adjacent in phase). Accordingly, the timing diagram 605 shows an overlap between the sampling window of a first unit-ADC (e.g., the sample window of the respective input clock signal of a first unit-ADC 305a) and the track-window of the T&H circuit (e.g., the T&H clock signal).

In contrast, timing diagram 610 illustrates alignment between T&H clock signals and unit-ADC input clock signals. Specifically, input clock signals of the respective unit-ADCs (e.g., ck_adc_j–0<0: N–1>) may be aligned so has to have a sampling-window that falls within the hold-window of the T&H clock signal, creating a time-margin, Tl, between the rising edge of the T&H clock signal (e.g., a hold-window) and the rising edge of the input clock signal (e.g., a sampling-window), also referred to as the "left" time-margin. Similarly, a "right" time margin, Tr may be created between the falling edge of the sampling-window of the input clock signal and the falling edge of the hold-window of the T&H clock signal (e.g., between the right side of the sampling-window and the falling edge of the hold-window).

Continuing with reference to elements of FIGS. 1-6, for each of the M/k-number of T&H circuits within each respective ADC-group, corresponds to one sub-ADC composed of an N-number of interleaved unit-ADCs. The sample-window of each unit-ADC may thus be aligned (e.g., calibrated) to be within the hold-window of the track-hold. Due to the different logic-depths on the respective clock paths to the T&H, and the clock paths to each of the respective unit-ADCs, alignment may change based on ambient PVT changes.

Accordingly, adaptive timing alignment is set forth below, in accordance with various embodiments. The adaptive timing alignment between respective T&H circuits and corresponding sub-ADCs, each of which includes N unit-ADCs, may be provided by the MIMO PI (e.g., MIMO PI 230) of a respective ADC-group.

For example, as depicted in FIG. 2, the MIMO PI 205 (e.g., MIMO PI<j>) may include M/k input phases and M/k output phases, and may include M/k-number of MIMO slices (or "unit-cells"), one for each respective output clock signal. As previously described, each unit-cell selects two neighboring phases from the M/k inputs through two respective M/2k: 1 multiplexers, and then interpolates the output clock signal by weighting the two selected input phases through two output connected s-bit thermometer-DACs. The output clock of the unit-cell thus covers the whole period of M×T for the track-hold and thus guarantees the optimum alignment between track-hold and unit-ADC.

In various embodiments, the M/k input phases are connected to each of the unit-cells and advances every k-phases between neighboring unit-cells in a cyclic way. By sharing the same control-code among all unit-cells, the M/k output phases are thus also k-phases apart for the M/K sub-ADCs (e.g., k×T spacing, as previously described). The MIMO PI<j> synthesized M/k phase clock may be configured to drive respective clock divider 510 and token generator 515. In some examples, the clock divider 510 may be a reset-less divider.

In various embodiment, the token generator 515 may be configured to generate sequenced tokens for synchronization between each of the M/k number of sub-ADCs (e.g., sub-ADCs 205a-2051) within a respective ADC-group (e.g., ADC-group 200). The sample-clocks of all unit-ADCs 305-305n within each of the M/k sub-ADCs 205a-2051 may move together with the rotation of the MIMO PI 230. Through adaptive alignment, each unit-ADC 305a-305n sampling window may be placed within the corresponding hold-window of the shared respective T&H circuit 210a-2101 within pre-defined left/right time-margins, (Tl, Tr as shown in timing diagram 610).

The output data sequence among each of the k distributed ADC-groups 105a-105k may, thus, be determined by the sequence each their respective tokens, which may further be generated from the output of the respective k clock dividers/token generators 110a-110k, 235 in each respective ADC-group 105a-105k.

Figure 7A:
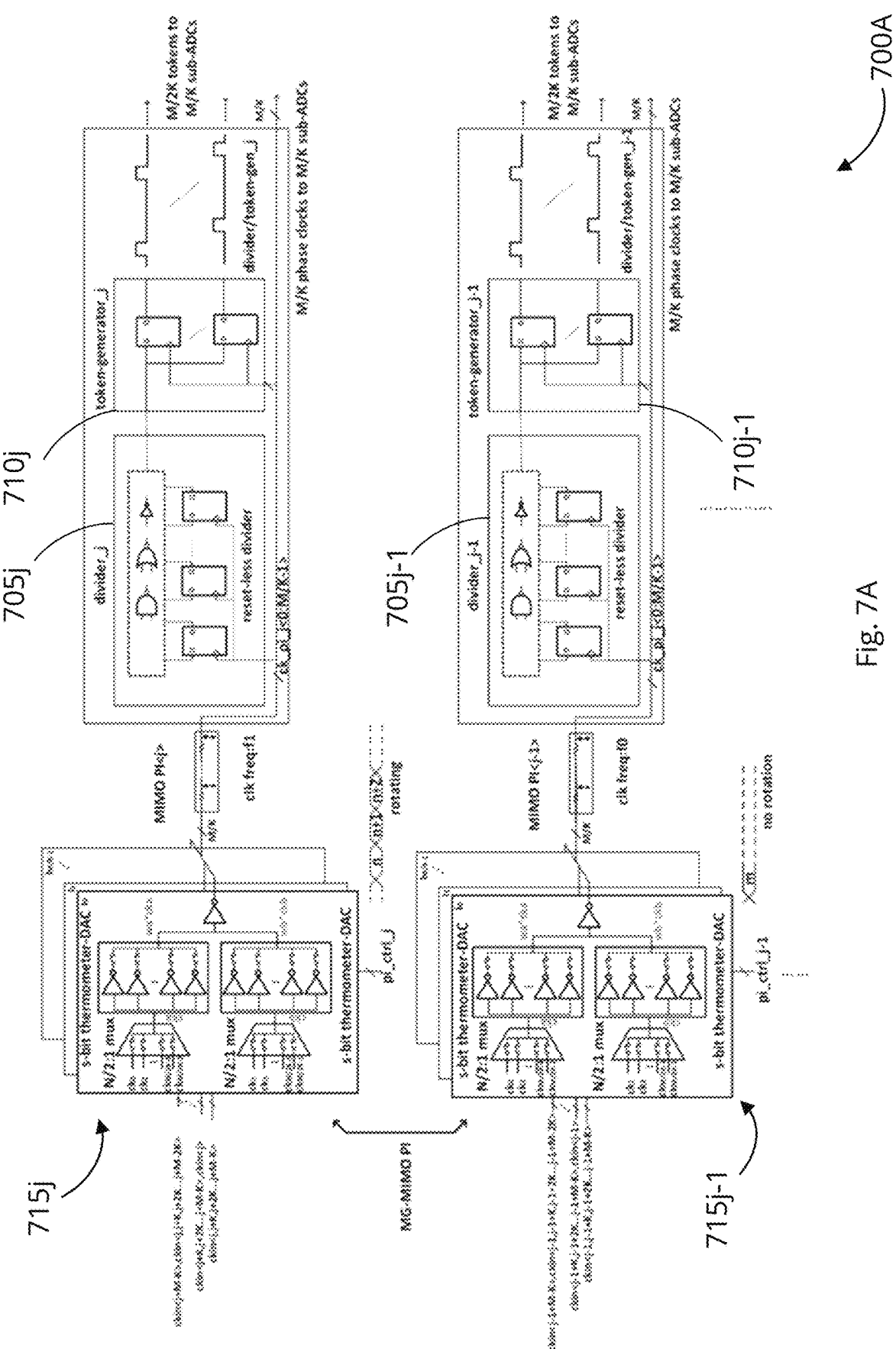
FIG. 7A is a schematic block diagram of an architecture for synchronization of respective clock dividers between ADC-groups, in accordance with various embodiments.

FIG. 7A is a schematic block diagram of an architecture 700A for synchronization of respective clock dividers between ADC-groups, in accordance with various embodiments. Specifically, the architecture 700A includes two neighboring ADC-groups, and more specifically, respective clock dividers 705j, 705j-1 (collectively "clock dividers 705") and token generators 710j, 710j-1 (collectively token generators 710) of two neighboring ADC-groups. Each clock divider 705 may be coupled to a respective MIMO PI 715j, 715j-1.

FIG. 7B is a state diagram 700B illustrating internal-state transfer status of the architecture 700A during synchronization, in accordance with various embodiments. Specifically, the state diagram 700B illustrates internal-state synchronization between each of the respective k-number of clock dividers in each ADC-groups. In various embodiments, the clock dividers may be a reset-less divider. Accordingly, a "reset-less" divider may refer to an architecture for a clock divider that does not rely on a reset signal for initialization and/or to recover from an invalid state (e.g., a return to a reset state or initial state based on a reset signal). A reset state, as used in this context, may refer to a state (e.g., an initial state or any other state) entered by the clock divider after a reset signal has been asserted. A valid state may refer to a state of the clock divider indicating normal operation. An invalid state may refer to a state of the clock divider that is not expected or otherwise should not be entered during normal operation of the clock divider.

Accordingly, with reference to FIGS. 7A & 7B (and previous FIGS. 1-6), in various examples, the reset-less dividers 705 may be able to recover from any invalid state and enter valid state transfer within a limited number of cycles, without reliance on a reset signal being issued. For example, in some embodiments, a frequency offset of the driven clocks (e.g., F1-F0) may be created between any two clock dividers 705. Thus, by state differences may be eliminated by advancing/decreasing a divider state based, at least in part, on the accumulated phase difference between the clock signals (e.g., input clock signal output by a respective clock divider).

The two requirements are fulfilled through cooperative rotations of respective MIMO PIs (e.g., 715j, 715j-1, 125a-125k) of the MG-MIMO-PI (e.g., MG-MIMO-PI 125), which may in turn drive respective clock dividers (e.g., the clock divider/token generators 110a-110k). Initially, a first divider (e.g., "divider_j" such as clock divider 705j, 510) may be in state "s0," while a second divider 705j-1 (e.g., "divider_j–1") may be in state "s1," which indicates ADC-group j and ADC-group j–1 are out of synchronization.

In various examples, by rotating the respective MIMO PI (e.g., MIMO PI 715j, 125j of one or more MIMO PIs 125a-125k) of ADC-group j (e.g., ADC-group 715j, 105j of one or more ADC-groups 105a-150k), while keeping MIMO PI associated with ADC-group j–1 portion static, the input clock signals driving divider j (clock divider 705j) and divider j–1 (clock divider 705j-1) would have a frequency offset f1-f0. This frequency offset becomes accumulated as a phase difference, and thus the initial internal-state differences between the two dividers may be eliminated, and ADC-groups j and j–1 may thus be synchronized.

The proposed inter-ADC-group synchronization scheme relies on the dynamic adjustment of internal state transitions of the respective clock dividers so as to synchronize the initially misaligned states during chip start-up, or to recover from disrupted invalid states, for example, contributed by ambient aggressors during operation.

Figure 8A:
FIG. 8A is a schematic block diagram of a reset-less divider, in accordance with various embodiments.
Figure 8A:
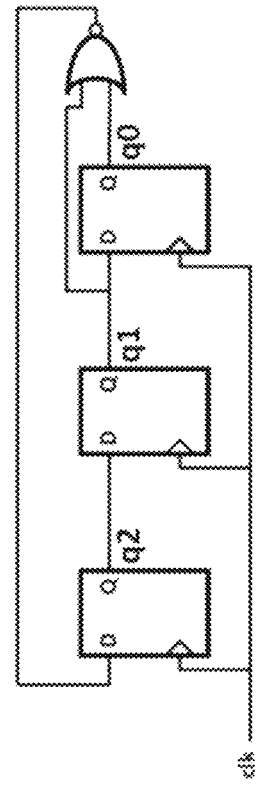
Figure 8A:
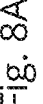
Figure 8B:
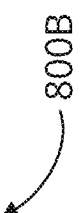
FIG. 8B is a state diagram illustrating internal state transitions of the reset-less divider, in accordance with various embodiments.
Figure 8B:
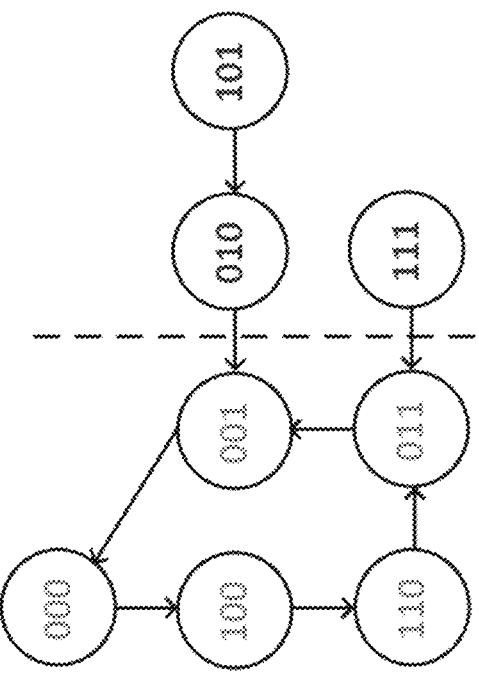

FIG. 8A is a schematic block diagram of a reset-less divider 800A, in accordance with various embodiments. The reset-less divider 800A may be a clock divider for a respective ADC-group, as described above. The reset-less divider 800 may comprise a sequence of one or more flip flops, latches, and/or registers. In the example depicted, the reset-less divider 800 may include a first flip-flop q0, second flip-flop q1, and third flip-flop q2. FIG. 8B is a state diagram 800B illustrating internal state transitions of the reset-less divider, in accordance with various embodiments.

Conventional reset-based clock divider architectures, an initial state is relied upon to ensure successful subsequent operation, and relies on a reset to recover from any invalid states. For example, after reset, the state transitions may start from an initial state (e.g., 10000 for a reset-based divider utilizing five flip-flops) and undergo four other valid states (e.g., 01000/00100/00010/00001) before re-entering state "10000." If the divider were to enter any invalid state, it would have no way to recover back to a valid state. Thus, the valid state sets and invalid state sets are disjointed.

With reference to FIGS. 8A & 8B, in various embodiments, the reset-less divider 800A may be configured so as not to rely on the initial state to ensure its following operation and its valid states set and invalid states set are connected. For example, taking one reset-less divide-by-5 implementation as an example, if the divider is within the valid state set, it will keep its state transferring within the valid state set. Similarly, if the divider 800A enters an invalid state set due to any disturbance, it will transfer back to the valid states set within a limited number of transition cycles (in this example, 1 or 2 cycles). In other words, the valid states set and the invalid states set are one-directionally joined towards the valid state set, and a valid state can eventually be entered from any state.

For example, with reference to FIG. 8B, in some embodiments, continuing with the three-bit example above, the set of valid states may include 000, 100, 110, 011, and 001. When the reset-less divider enters one of the invalid states 010, 101, or 111, the reset-less divider may, within 1 or 2 clock cycles, enter a valid state (in this example, 001 or 011).

By combining T&H and unit-ADC alignment (e.g., intra-ADC-group alignment) as described above with respect to FIGS. 5 & 6, and clock divider/token generator alignment among ADC-groups (e.g., inter-ADC-group alignment) as described above with respect to FIGS. 7A, 7B, 8A, and 8B, a two-step synchronization scheme is set forth, simultaneously addressing both.

Figure 9:
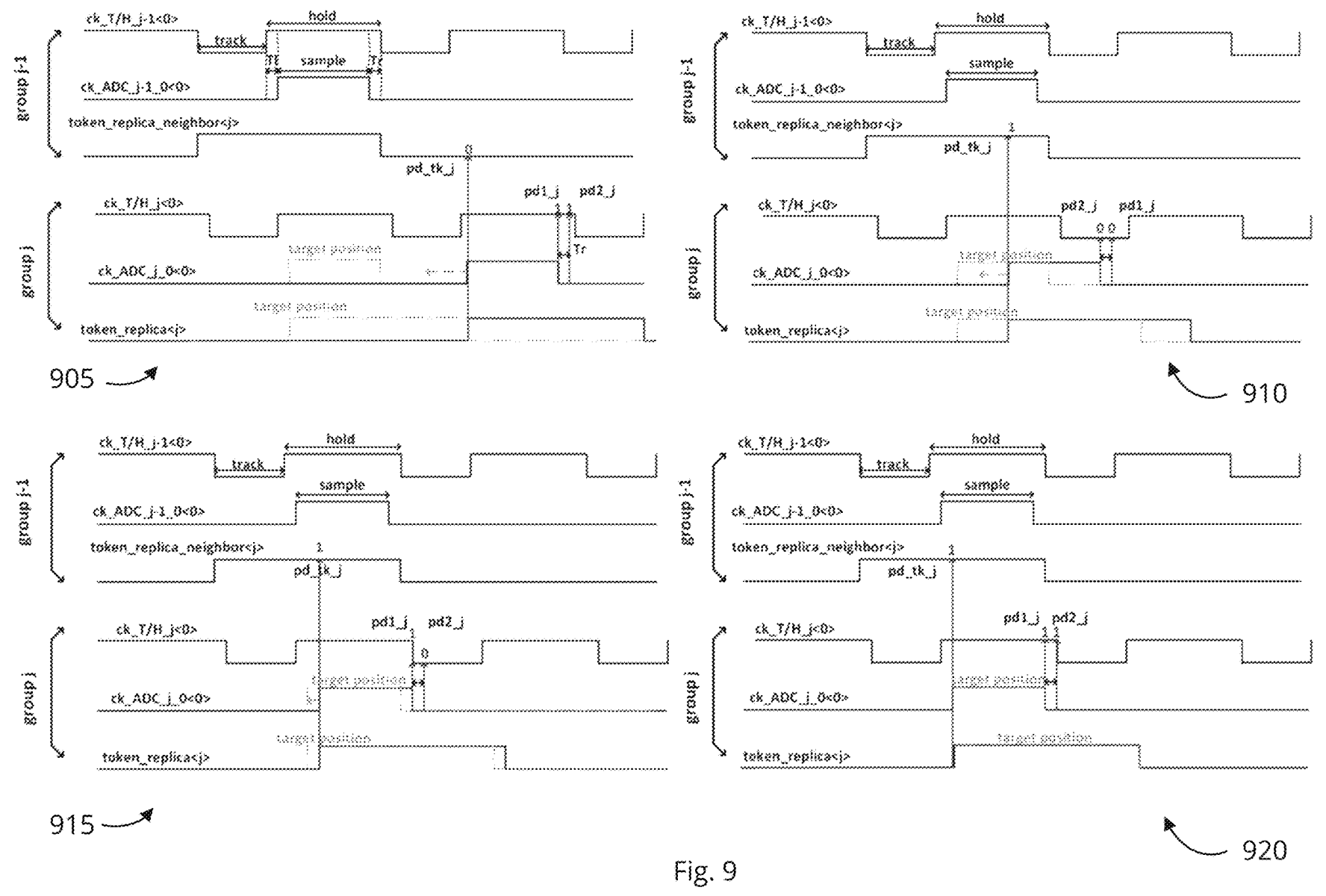

FIG. 9 illustrates a series of timing diagrams illustrating alignment between T&H clocks, unit ADC clocks, and token signals during two-step synchronization, in accordance with various embodiments.

Specifically, a first timing diagram 905 illustrates an initial state of the clock signals at the beginning of a two-step synchronization process. To synchronize ADC-group j, it may be assumed that synchronization in ADC-group j–1 has been achieved at the start status (the clock divider/token generator is in targeted state & the T&H hold window is aligned with the respective unit-ADCs sampling window with proper left/right time margin in ADC-group j–1).

A second timing diagram 910 illustrates coarse inter-ADC group alignment of signals. Specifically, to synchronize the clock divider of ADC-group j, a coarse synchronization to pull-in the clock divider of ADC-group j may be performed. Specifically, the respective MIMO PI of ADC-group j may be rotated while keeping the control-code of all the other branches static (e.g., unchanged). Specifically, by rotating the PI, the phase of the replica token signal may be "pulled in," (e.g., delayed), and the rising edge of the replica token signal may coincide with a window where the replica token of a neighboring ADC-group (e.g., ADC-group j–1) is at a logic level "high" (e.g. token_replica_neighbor<j>=1). A logic level "high" may also interchangeably referred to as a "logic high." Thus, the MIMO PI of ADC-group j may be rotated until the output of the phase detector (depicted in FIG. 10B) may be pd_tk_j=1 (e.g., logic high).

Outputs of the respective clock divider/token generator may be monitored via a respective phase detection circuit, such as replica and phase detection circuit 220. In some examples, the phase detection circuit may include phase detectors for tracking the phase of the token (e.g., outputs of the token generator), and T&H clock/unit-ADC clocks. Thus, the outputs of the phase detectors (e.g., pd_tk_j, pd1_j, pd2_j) may be monitored to track the phase of the respective signals. As previously described, the MIMO PI of ADC-group j may be rotated until pd1_j=1, and pd2_j=0. Once this is achieved, the coarse synchronization may be considered complete.

The third timing diagram 915 and fourth timing diagram 920 depict the beginning of the second step or "fine" intra-ADC synchronization process. The coarse first step synchronization depicted in timing diagrams 905, 910 and fine second step synchronization depicted in timing diagrams 915, 920 are described in greater detail below with reference to FIGS. 10A & 10B.

Figures 10A, 10B:
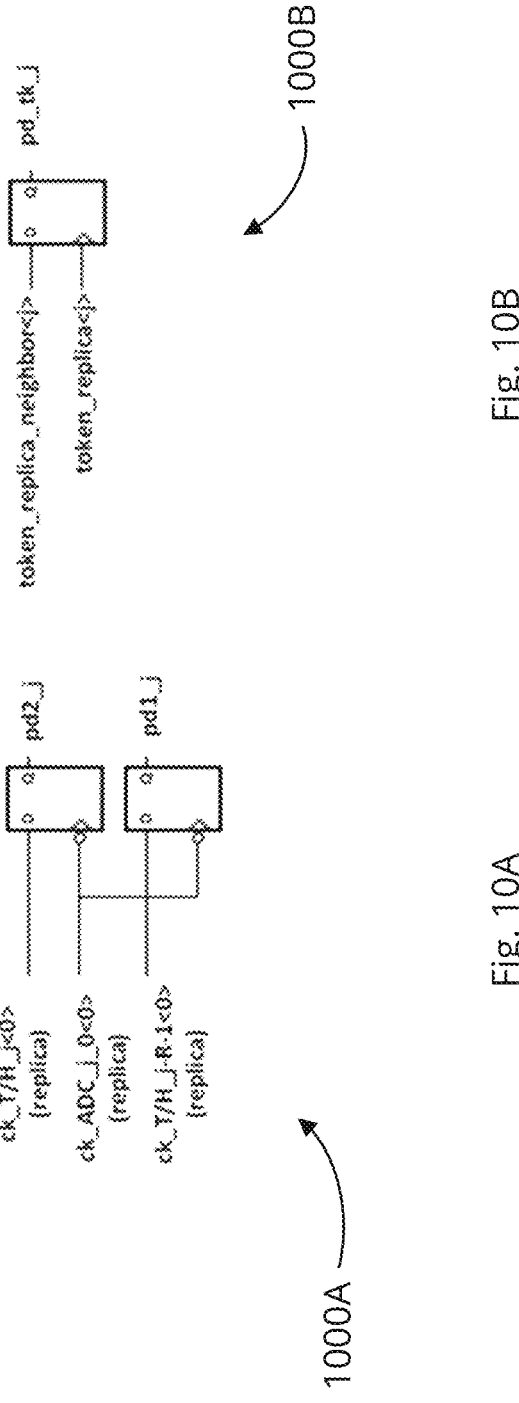
FIG. 10A is a schematic block diagram of a 2-bit phase detector for intra-ADC-group track and hold, in accordance with various embodiments.
FIG. 10B is a schematic block diagram of a 1-bit phase detector for inter-ADC-group divider/token generation, in accordance with various embodiments.

FIG. 10A is a schematic block diagram of a 2-bit phase detector 1000A for intra-ADC-group track and hold, in accordance with various embodiments. FIG. 10B is a schematic block diagram of a 1-bit phase detector 1000B for inter-ADC-group divider/token generation, in accordance with various embodiments. Accordingly, the phase detector 1000A may receive, as input, T&H clock (e.g., ck_T/H_j<0>), unit-ADC input clocks (e.g., ck_ADC_j_0<0>) and a replica input clock signal RxT margin delayed in phase (e.g., ck_ADC_J-R–1<0>).

In some examples, the phase detectors 1000A, 1000B may include, for example, one or more flip-flops. In one example, the phase detectors 1000A, 1000B may be implemented as D flip-flops. In various embodiments, an input of the phase detector 1000A detector may be configured to accept a replicated first first-level clock signal (e.g., a replicated T&H clock signal) from T&H replica circuit of replica and phase detector circuits 115a-115k, 220 of FIGS. 1 & 2. Thus, ck_T/H_j<0> may be a replicated signal. The replicated first-level clock signal may be used as a reference for the phase detector 1000A. Similarly, the input of the neighboring T&H clock may also be a replicated signal, and used as a reference signal. Accordingly, as used herein, a reference signal may generically refer to a signal that is used for comparison by the phase detectors 1000A-1000B. Each of the reference signals (e.g., ck_T/H_j<0> and ck_T/H_j-R–1) may be clocked by a replicated second-level ADC clock (e.g., an input clock of a unit-ADC, such as ck_ADC_j_0<0>), which in some examples, may be obtained from an ADC replica circuit of replica and phase detector circuits 115a-115k, 220.

In various embodiments, a left-margin of the second-level ADC clock may be defined as the time-space between a rising-edge (hold-edge) of the first-level track-and-hold clock (e.g., first-level clock signal) $\phi_{1,0}$ and the rising-edge (sample-edge) of second-level ADC clock $\phi_{2,0,0}$. Any time violation may lead to overlap of the settling time window of track-hold and ADC. A right-margin may be the time-space between falling-edge (sample-edge) of the first-level track-hold clock and the falling-edge (hold-edge) of the second-level ADC clock. Any time violation may lead to incorrect sampled data. Thus, sample clocks may be aligned to ensure appropriate left and right-margins.

In some examples, an alignment target may be set to adaptively keep the falling-edge (sample-edge) of the second-level ADC clock from the falling-edge of the first-level clock by a time space RxT. Thus, in some examples, RxT may be set to (PxT–QxT)/2. As shown in the example timing diagram, in such examples, the left-margin & right-margins may be evenly distributed (e.g., set equal to each other).

Thus, the phase relationship between the first-level clock signals may be leveraged to generate the proper time margin with the respective input clock. In other words, inherent time differences between the different phases of the first-level clock signal are utilized to set-up references for time-margins. Specifically, the replicated first-level clock signal ck_T/H_j<0> may be used as the reference of pd2, and replicated first-level clock signal ck_T/H_j-R–1<0> as the reference of pd1. For the right-margin, the two reference waveforms may be sampled by the falling-edge of the replicated second-level ADC clock (e.g., ck_ADC-J_0<0>) to create an RxT right-margin.

Similarly, phase detector 1000B may receive, as input, a token replica from a neighboring ADC-group (token_replica_neighbor<j>), and may be clocked by a replica of the respective token (token_replica<j>), which may be obtained via the token replica circuit of replica and phase detector circuits 115a-115k, 220.

In some examples, the following conditions may indicate alignment of the respective clock divider/token generators 110a-110k:

$$pd\_tk\_j = 1;$$

$$pd1\_j = 1; \text{ and}$$

$$pd2\_j = 0 \qquad \text{(Eq. 1)}$$

In a second step, synchronization within each ADC-group (e.g., intra-ADC-group synchronization), between the T&H circuit and unit-ADCs may be performed. For example, in some embodiments, fine synchronization may be performed to align the time window between a respective T&H clock signal and unit-ADCs input clock signal, while retaining the synchronization of the inter-ADC-group divider/token-generators. The third timing diagram 915 depicts the beginning of the second step of the two-step synchronization.

Specifically, the respective MIMO PI of ADC-group j may be rotated while keeping the control-code of all the other branches static (e.g., unchanged) (e.g., rotated left/delayed in phase).

Outputs of the respective T&H clock generators (e.g., a T&H clock signal) and MIMO PI (e.g., MIMO PI 125j) may be monitored via respective phase detectors (e.g., pd_tk_j, pd1_j, pd2_j) may be monitored to track the phase of the respective signals.

In some examples, the following conditions may indicate alignment of the respective T&H clock signal and input clock signals from the clock divider:

$$pd\_tk\_j = 1;$$

$$pd1\_j = 1; \text{ and} \qquad \text{(Eq. 2)}$$

pd2_j transitions from 0 to 1, or alternatively 1 to 0

When the phase detector output, pd2_j, transitions from '0' to '1,' it indicates that PI last-step quantization error has been absorbed in the left time margin, Tl, and when pd2_j transitions from '1' to '0,' it may indicate that PI last-step quantization error has been absorbed in the right time-margin, Tr. This state is depicted in fourth timing diagram 920.

Thus, both inter- and intra-ADC-group synchronization may be achieved by rotation of respective MIMO PIs of the MG-MIMO-PI 125.

Regarding the sample clock time-margins Tl and Tr, as previously described, the Tl (or left-margin) may be defined as the time between a rising-edge (e.g., "hold-edge") of track-hold clock ck_T/H_j<0> and the rising-edge (e.g., "sample-edge") of unit-ADC clock ck_adc_j_0<0>. A violation of the Tl may result in overlap of the settling time window of T&H circuit and the respective unit-ADC. The Tr (right-margin), may be defined as time between a falling-edge (e.g., "sample-edge") of T&H clock ck_T/H_j<0> and the falling-edge (e.g., "hold-edge") of unit-ADC input clock ck_adc_j_0<0>. A violation of the right-margin may lead to incorrectly sampled data.

Accordingly, in various embodiments, the two-step alignment above may work to adaptively synchronize the time-windows of the T&H clock and respective input clocks to the unit-ADC, and more specifically to adaptively keep the falling-edge (sample-edge) of unit-ADC clock from the falling-edge of T/H clock with a time space R×T. For example, by setting R×T to ((P−Q)×T)/2, the left-margin and right-margin may be evenly distributed, where "P×T" is the length of the sample window of the T&H clock signal, and "Q×T" is the length of the sample window of a respective unit-ADC input clock.

Furthermore, the two-step alignment may work to adaptively maintain inter-ADC-group synchronization, such that respective clock dividers (e.g., clock divider/token generators 110a-110k) remain synchronized.

Accordingly, as previously described, in various examples, intra-ADC-group T&H and unit-ADC synchronization may utilize inherent time differences between different phases instead of inverter-delays to set-up references for time-margins. Thus, by using ck_T/H_j<0> (replica) as the reference of pd1 and ck_T/H_j-R−1<0> (replica) as the reference of pd2, the reference signals may be sampled by a falling-edge of ck_adc_j_0<0> (replica) to create the R×T right-margin. When synchronized, pd2 may be aligned to the falling-edge of ck_T/H_j-R−1<0> (replica) while pd1 is R×T away from the falling-edge of ck_T/H_j<0> (replica), which will produce a targeted time-margin as the time difference between these two bits of the phase-detector. The absolute value of left/right-margin defined by phases, naturally scales as the clock rate changes, and is able to support a wide range of data rates.

With regard to inter-ADC-group clock divider/token-generator synchronization, through comparison of the token positions generated by each clock divider/token generator 110a-110k, 235, alignment of tokens may be achieved. For example, by utilizing a rising-edge of the replica token signal, token_replica<>, of ADC-group j to sample a replica token signal of a neighboring ADC-group j−1 (e.g., a neighboring token signal), (token_replica_neighbor<j>), which may, in some examples, be delayed in phase relative to the replica token signal. A sufficient detection margin may be achieved once the single-optimum position is achieved when the output of phase detector 1000B pd_tk_j=1. Thus, as used herein, the neighboring signal may refer to an immediately preceding ADC-group (e.g., in phase of a respective token signal).

In various embodiments, this condition may be satisfied within only one specific M×T time window, which repeats in a period of M×N×T, where T is the sample-period of the TI-ADC 100.

Figure 11:
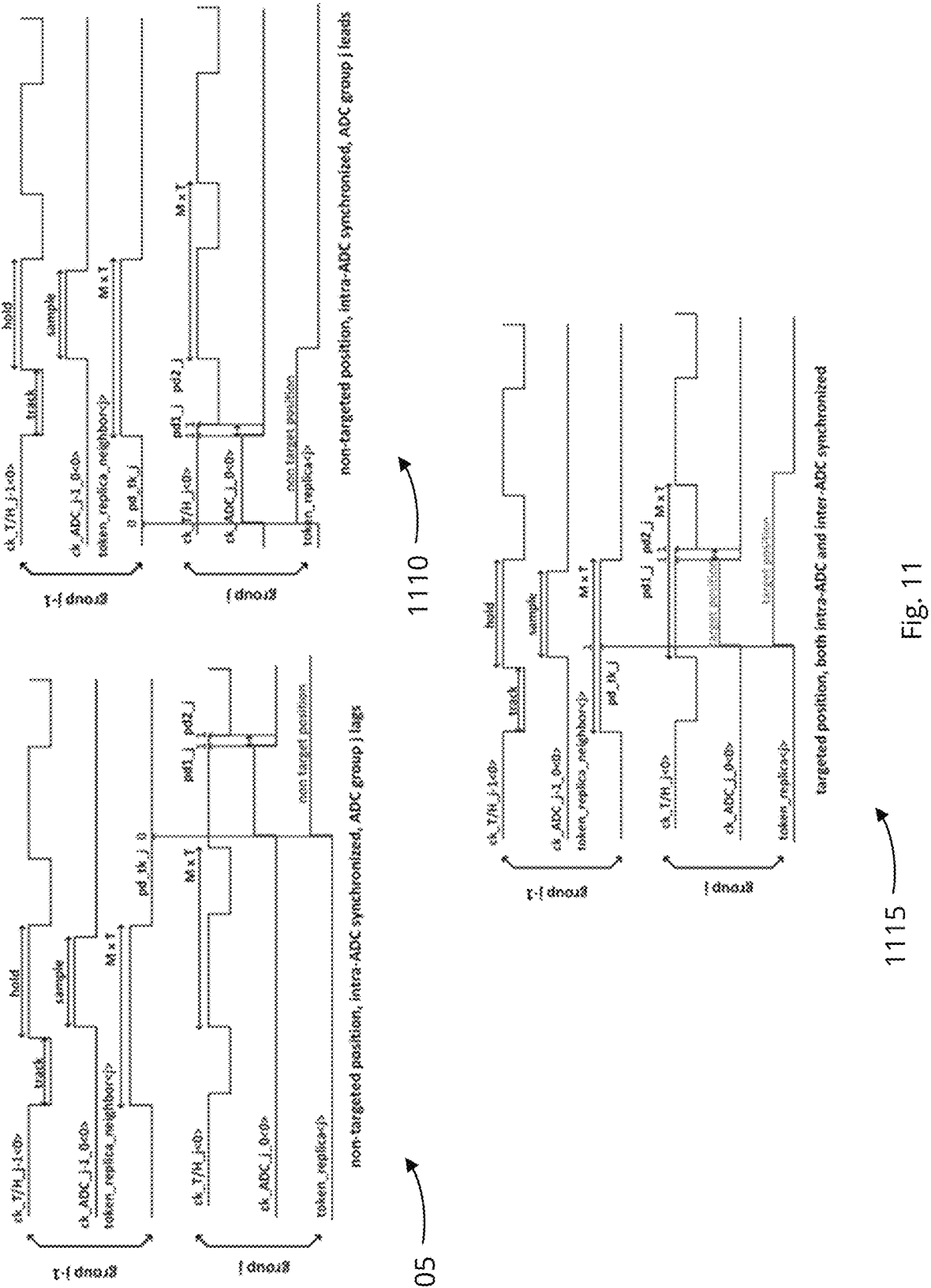
FIG. 11 is a series of timing diagram illustrating alignment between T&H clocks, unit ADC clocks, and token signals during two-step synchronization, in accordance with various embodiments.

FIG. 11 illustrates a series of timing diagrams illustrating targeted alignment between T&H clocks, unit ADC clocks, and token signals during two-step synchronization, in accordance with various embodiments. Specifically, a first timing diagram 1105 and second timing diagram 1110 illustrate a non-targeted alignment state in which intra-ADC synchronization is achieved between T/H and unit-ADC clocks, but inter-ADC synchronization is not achieved (e.g., pd_tk_j=0). Specifically, in the first timing diagram 1105, ADC-group j may lag behind too far behind ADC-group j−1, whereas in the second timing diagram 1110, ADC-group j leads ADC-group j−1.

Intra-ADC-group synchronization, as shown, may be satisfied in one specific position at every M×T time window. Thus, there may be multiple points at which intra-ADC-group synchronization may be achieved without inter-ADC-group synchronization. Thus, through the two-step synchronization process, both the specific M×T time window and specific position within the M×T time window may be selected for synchronization.

In contrast, as shown in third timing diagram 1115, inter-ADC group synchronization (e.g., pd_tk_j=1) may be achieved within only one M×T time window (which repeats ever M×N×T period), as opposed to every M×T time window, as occurs with intra-ADC synchronization. Thus, in various examples, the adaptation engine (e.g., adaptation engine 120) may rotate MIMO PIs of the MG-MIMO-PI 125 until the single optimum position is found, via a cooperative foreground and background calibration scheme. A rotation of the MIMO PI may alternatively be called a "PI shift." A left shift may correspond to a counterclockwise rotation, and a right shift may correspond to a clockwise rotation.

Figure 12A:
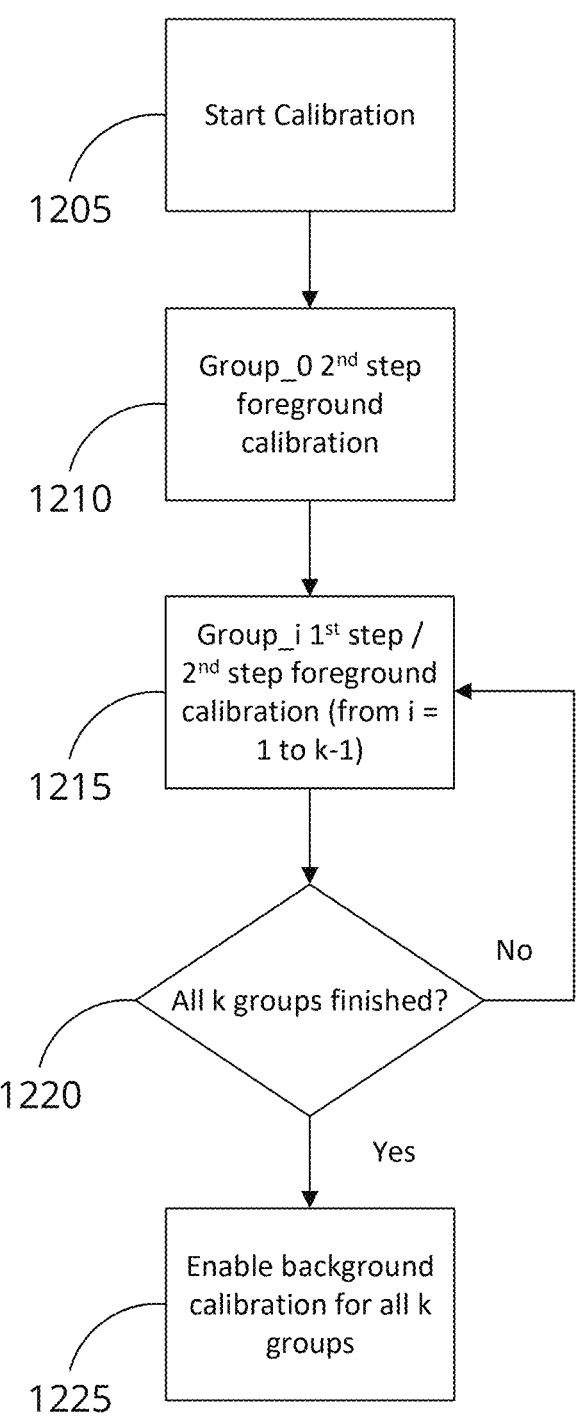
FIG. 12A is a flow diagram illustrating a method of implementing a cooperative foreground and background calibration scheme, in accordance with various embodiments.

FIG. 12A is a flow diagram of a method 1200A for cooperative foreground and background calibration scheme, in accordance with various embodiments. The method begins, at block 1205, with the start of the two-step calibration of the TI-ADC. Specifically, at block 1210, a foreground calibration of the TI-ADC may begin with a second step synchronization (e.g., intra-ADC calibration) of ADC-group 0 (e.g., "Group_0"), as previously described.

At block 1215, upon completion of the second step calibration, a first step and second step group-by-group calibration may be performed. Specifically, subsequent ADC-groups (e.g., Group_1 to Group k−1) both inter-ADC-group synchronization and intra-ADC-group synchronization (e.g., first and second step) from ADC-group 1 to ADC-group k−1 (for a total of k ADC-groups), as previously described. At decision block 1220, it is determined whether first and second step synchronization has been completed for all k-number of groups.

At block 1225, background calibration may be enabled for all groups once the sequential foreground calibration (e.g., two-step synchronization) is finished. The background calibration within each distributed-ADC-group may, in various examples, be monitored and controlled by the adaptation engine (e.g., adaptation engine 120).

Figure 12C:
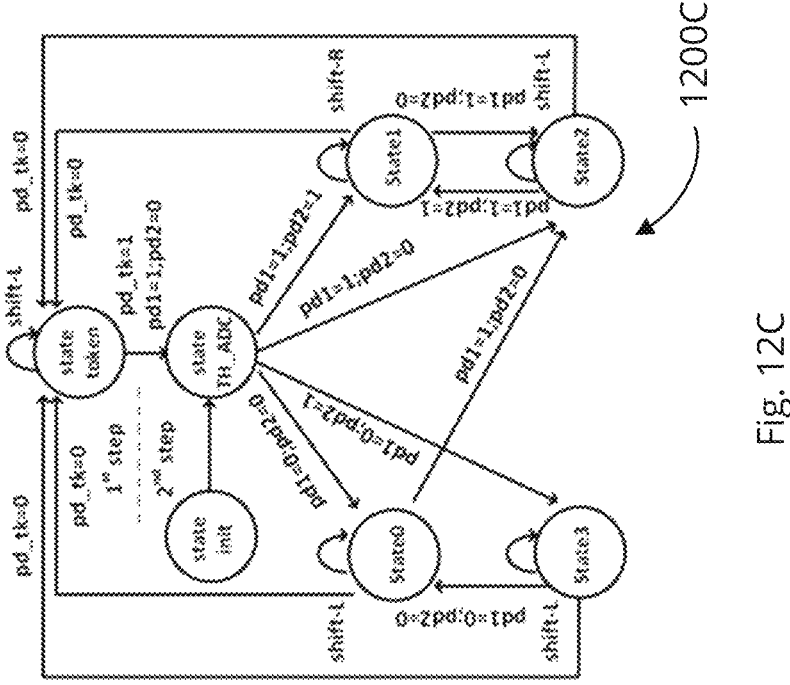
FIG. 12C is a state machine diagram for background synchronization calibration, in accordance with various embodiments.
Figure 12B:
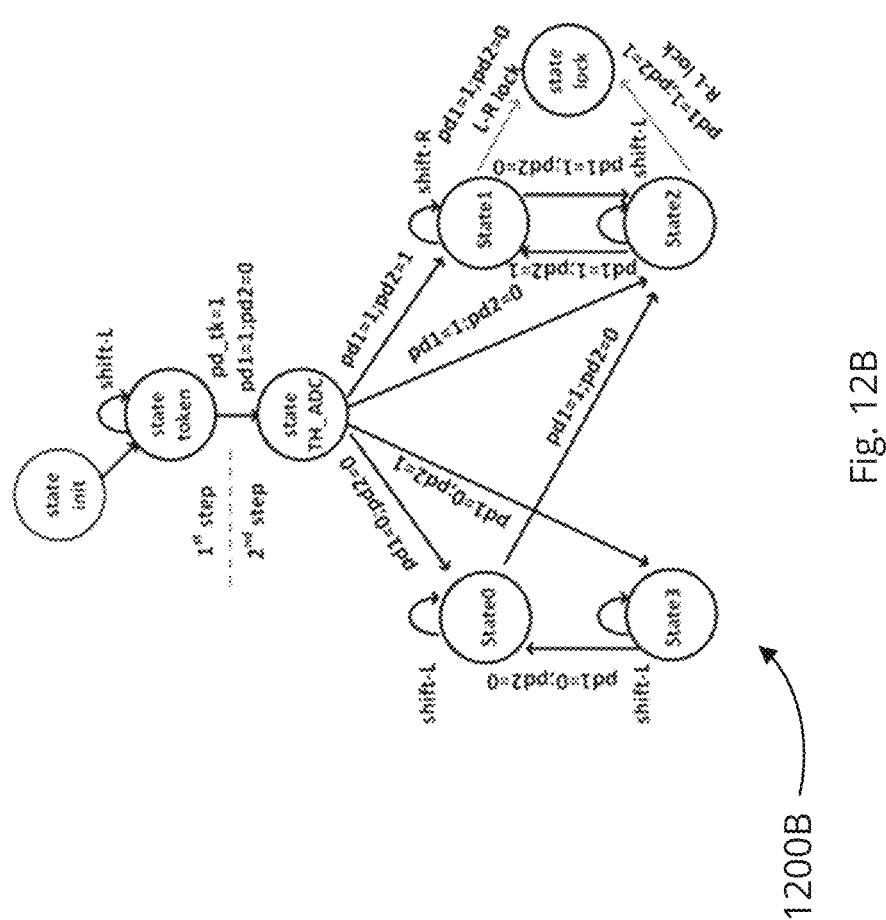
FIG. 12B is state machine diagram for foreground synchronization calibration, in accordance with various embodiments.

FIG. 12B is state machine diagram for foreground synchronization calibration 1200B, in accordance with various embodiments. In various examples, foreground calibration may include both inter-ADC-group synchronization and intra-ADC-group synchronization, as previously described. For example, as previously set forth, inter-ADC-group synchronization may begin in an initial state, and proceed to synchronize a given ADC-group by rotation of a respective MIMO PI of the MG-MIMO-PI (e.g., MG-MIMO-PI 125) to the left (denoted as "shift-L") until pd_tk='1,' pd1='1,' and pd2='0.'

In various examples, this condition may indicate that the respective clock divider/token generator of a respective group (e.g., ADC-group j) has been pulled-in to the targeted state and the intra-ADC-group timing is near its optimized condition.

Next, intra-ADC-group synchronization may be performed. Intra-ADC-group T&H and unit-ADC synchronization may follow state transitions between four states (e.g., state 0, state 1, state 2, state 3) based on pd1 and pd2. As previously described, intra-ADC-group synchronization may be achieved when 1) pd1='1,' pd2='0,' in state 1, or "L-R lock mode," which ensures that final rotation steps from left to right so as to absorb quantization error to the right-margin; or 2) pd1='1,' and pd2='1,' in state 2, or "R-L lock mode," which ensures final rotation steps from right to left so as to absorb quantization error to the left-margin. Thus, when in state 0 or state 3, the MIMO PI may be rotated left (shift-L) until one of state 1 or state 2 is entered. Once state 1 or state 2 is reached, a lock state may be entered.

In some examples, the lock state may be detected following the above described with one-directional consistent locking scheme. In other words, once state 2 has been entered, the respective MIMO PI may be consistently shifted in one direction, to the left, to ensure right-to-left locking. Alternatively, once state 1 has been entered, the respective MIMO PI may be shifted in one direction, to the right ("shift-R") in an L-R lock state. Thus, in various examples, a consistent one-directional locking scheme is adopted, such as a left-to-right locking scheme, or right-to-left locking scheme. In some examples, by utilizing a one-directional locking scheme, the least-significant-bit (LSB) error introduced by the last shift of PI may be kept consistent. Specifically, in right-to-left locking, the lock state is always detected as a transition from state 2 to state 1, and thus always absorbs the LSB error as left-margin reduction. Conversely, in a left-to-right locking scheme, the lock state is always detected as a transition from state 1 to state 2, and thus always absorbs the LSB error as right-margin reduction. Thus, by adopting a one-direction locking scheme, the effects of LSB error may be limited to consistently affecting the margin of a respective side.

FIG. 12C is a state machine diagram for background synchronization calibration 1200C, in accordance with various embodiments. In various examples, background calibration may skip inter-ADC-group calibration, and directly begin intra-ADC-group calibration. For example, in some embodiments, the locking status from the foreground calibration may be retained through the state transitions based on pd_tk, pd1, and pd2 as described above. Accordingly, depending on the state and locking status, the respective MIMO-PI may be shifted (left or right) until pd_tk=0, after which the intra-ADC-group synchronization procedure may be performed as described previously.

While some features and aspects have been described with respect to the embodiments, one skilled in the art will recognize that numerous modifications are possible. For example, while various methods and processes described herein may be described with respect to particular structural and/or functional components for ease of description, methods provided by various embodiments are not limited to any particular structural and/or functional architecture but instead can be implemented in any suitable hardware configuration. Similarly, while some functionality is ascribed to one or more system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with or without some features for ease of description and to illustrate aspects of those embodiments, the various components and/or features described herein with respect to a particular embodiment can be substituted, added and/or subtracted from among other described embodiments, unless the context dictates otherwise. Consequently, although several embodiments are described above, it will be appreciated that the invention is intended to cover all modifications and equivalents within the scope of the following claims.

What is claimed is:

1. An analog to digital converter (ADC) comprising:
a multi-group multiple input multiple output phase interpolator (MG-MIMO-PI) comprising one or more multiple input multiple output phase interpolators (MIMO-PI), the MG-MIMO-PI configured to receive a first clock signal, wherein a first MIMO-PI of the one or more MIMO-PIs is configured to generate a second clock signal based on the first clock signal;
one or more analog to digital converter groups (ADC-groups), each ADC-group of the one or more ADC-groups coupled to a respective MIMO-PI, a first ADC-group of the one or more ADC-groups being coupled to the first MIMO PI, wherein the first ADC-group comprises:
a clock divider configured to generate a third clock signals based, at least in part, on the second clock signal;
a token generator configured to generate a first token signal based, at least in part, on the second clock signal;
one or more sub-analog to digital converters (sub-ADCs), a first sub-ADC of the one or more sub-ADCs comprising:
one or more unit-analog to digital converters (unit-ADCs) configured to sample an input signal based, at least in part, on the third clock signal;
a first phase detector configured to generate a first output indicating a phase of the first clock signal relative to a phase of the third clock signal, and a second output indicating a phase of a first reference signal relative to the phase of the third clock signal; and
a second phase detector configured to generate a third output indicating a phase of the token signal relative to a second reference signal; and
an adaptation engine configured to:
perform a foreground calibration, wherein the foreground calibration is configured to cause the first token signal of the first ADC-group to be aligned with a second token signal of a second ADC-group; and
perform a background calibration, wherein the background calibration is configured to cause the third clock signal to be aligned with the first clock signal such that a first time margin is created between a falling edge of the first clock signal and a falling edge of the third clock signal.

2. The analog to digital converter of claim 1, wherein the clock divider is a reset-less divider, wherein the reset-less divider comprises a first set of valid states, and second set of invalid states.

3. The analog to digital converter of claim 2, wherein when the clock divider enters an invalid state of the second set of invalid states, the clock divider is configured to return to a valid state of the first set of valid states without entering a reset state based on a reset signal.

4. The analog to digital converter of claim 1, wherein the first phase detector is configured to receive a first replica of the first clock signal and a replica of the third clock signal, and wherein the first reference signal is a second replica of the first clock signal, wherein the first reference signal has a different phase from the first replica of the first clock signal.

5. The analog to digital converter of claim 1, wherein the second phase detector is configured to receive a replica of the token signal, and wherein the second reference signal is a replica of the second token signal, wherein the second token signal is a neighboring token signal of a neighboring ADC-group delayed in phase from the replica of the token signal.

6. The analog to digital converter of claim 1, wherein the adaptation engine is configured to generate a control signal, wherein the control signal is configured to cause a phase interpolator shift in the first MIMO-PI, and wherein the control signal is generated based on a state that is determined based on the first output of the first phase detector, second output of the first phase detector, and third output of the second phase detector.

7. The analog to digital converter of claim 6, wherein the state is one of a first state, a second state, a third state, or a fourth state, wherein the phase interpolator shift is determined based on the state, wherein in the first state, the first output and second output are both logic low, and the phase interpolator shift is left, wherein in the second state, the first output and second output are both logic high, and the phase interpolator shift is right, wherein in the third state, the first phase-detector output is logic high and the second phase-detector output is logic low, and the phase interpolator shift is left, wherein in the fourth state, the first phase-detector output is logic low and the second phase-detector output is logic high, and the phase interpolator shift is left.

8. The analog to digital converter of claim 7, wherein a lock state is entered according to a locking scheme, wherein the adaptation engine is configured to enter the lock state in response to determining that the first state has been entered from the second state.

9. The analog to digital converter of claim 6, wherein the foreground calibration comprises generating the control code to cause the phase interpolator to shift left, wherein foreground calibration is completed when the third output is logic high, the first output is high, and second output is low.

10. The analog to digital converter of claim 9, wherein the foreground calibration is completed sequentially for all ADC-groups of the one or more ADC-groups, wherein after foreground calibration is completed for all ADC-groups, background calibration is performed.

11. An apparatus comprising:

a first phase interpolator (PI) of a plurality of phase interpolators, the first phase interpolator configured to receive a first clock signal and generate a second clock signal based on the first clock signal;

a first analog to digital converter-group (ADC-group) of a plurality of ADC-groups, wherein the first ADC-group comprises:

a clock divider configured to generate a third clock signals based, at least in part, on the second clock signal;

a token generator configured to generate a first token signal based, at least in part, on the second clock signal;

a first sub-analog to digital converter (sub-ADC) of one or more sub-ADCs comprising:

one or more unit-analog to digital converters (unit-ADCs) configured to sample an input signal based, at least in part, on the third clock signal;

a first phase detector configured to generate a first output indicating a phase of the first clock signal relative to a phase of the third clock signal, and a second output indicating a phase of a first reference signal relative to the phase of the third clock signal; and a second phase detector configured to generate a third output indicating a phase of the token signal relative to a second reference signal; and control logic configured to:

perform a foreground calibration, wherein the foreground calibration is configured to cause the first token signal of the first ADC-group to be aligned with a second token signal of a second ADC-group; and perform a background calibration, wherein the background calibration is configured to cause the third clock signal to be aligned with the first clock signal such that a first time margin is created between a falling edge of the first clock signal and a falling edge of the third clock signal.

12. The apparatus of claim 11, wherein the clock divider is a reset-less divider.

13. The apparatus of claim 11, wherein the first phase detector is configured to receive a first replica of the first clock signal and a replica of the third clock signal, and wherein the first reference signal is a second replica of the first clock signal, wherein the first reference signal has a different phase from the first replica of the first clock signal, and wherein the second phase detector is configured to receive a replica of the token signal, and wherein the second reference signal is a replica of the second token signal, wherein the second token signal is a neighboring token signal of a neighboring ADC-group delayed in phase from the replica of the token signal.

14. The apparatus of claim 11, wherein the control logic is configured to generate a control signal, wherein the control signal is configured to cause a phase interpolator shift in the first PI, and wherein the control signal is generated based on a state that is determined based on the first output of the first phase detector, second output of the first phase detector, and third output of the second phase detector.

15. The apparatus of claim 14, wherein the state is one of a first state, a second state, a third state, or a fourth state, wherein the phase interpolator shift is determined based on the state, wherein in the first state, the first output and second output are both logic low, and the phase interpolator shift is left, wherein in the second state, the first output and second output are both logic high, and the phase interpolator shift is right, wherein in the third state, the first phase-detector output is logic high and the second phase-detector output is logic low, and the phase interpolator shift is left, wherein in the fourth state, the first phase-detector output is logic low and the second phase-detector output is logic high, and the phase interpolator shift is left.

16. The apparatus of claim 14, wherein the foreground calibration comprises generating the control code to cause the phase interpolator to shift left, wherein foreground calibration is completed when the third output is logic high, the first output is high, and second output is low.

17. A system for analog to digital converter calibration comprising:

a multi-group multiple input multiple output phase interpolator (MG-MIMO-PI) comprising one or more multiple input multiple output phase interpolators (MIMO-PI), the MG-MIMO-PI configured to receive a first clock signal, wherein a first MIMO-PI of the one or more MIMO-PIs is configured to generate a second clock signal based on the first clock signal;

a first analog to digital converter (ADC) comprising:

a clock divider configured to generate a third clock signals based, at least in part, on the second clock signal;

a token generator configured to generate a first token signal based, at least in part, on the second clock signal;

control logic configured to:

perform a foreground calibration, wherein the foreground calibration is configured to cause the first token signal to be aligned with a second token signal of a second ADC; and perform a background calibration, wherein the background calibration is configured to cause the third clock signal to be aligned with the first clock signal such that a first time margin is created between a falling edge of the first clock signal and a falling edge of the third clock signal.

18. The system of claim 17, wherein the clock divider is a reset-less divider.

19. The system of claim 17, wherein the control logic is configured to generate a control signal, wherein the control signal is configured to cause a phase interpolator shift in the first PI, and wherein the control signal is generated based on a state that is determined based on the first output of the first phase detector, second output of the first phase detector, and third output of the second phase detector, wherein the state is one of a first state, a second state, a third state, or a fourth state, wherein the phase interpolator shift is determined based on the state, wherein in the first state, the first output and second output are both logic low, and the phase interpolator shift is left, wherein in the second state, the first output and second output are both logic high, and the phase interpolator shift is right, wherein in the third state, the first phase-detector output is logic high and the second phase-detector output is logic low, and the phase interpolator shift is left, wherein in the fourth state, the first phase-detector output is logic low and the second phase-detector output is logic high, and the phase interpolator shift is left.

20. The system of claim 17, wherein the foreground calibration comprises generating the control code to cause the phase interpolator to shift left, wherein foreground calibration is completed when the third output is logic high, the first output is high, and second output is low.

\* \* \* \* \*